United States Patent
Adib et al.

(10) Patent No.: US 11,756,847 B2
(45) Date of Patent: Sep. 12, 2023

(54) METHOD OF MANUFACTURING A GLASS ARTICLE TO PROVIDE INCREASED BONDING OF METAL TO A GLASS SUBSTRATE VIA THE GENERATION OF A METAL OXIDE LAYER, AND GLASS ARTICLES SUCH AS GLASS INTERPOSERS INCLUDING THE METAL OXIDE LAYER

(71) Applicant: CORNING INCORPORATED, Corning, NY (US)

(72) Inventors: Kaveh Adib, Corning, NY (US); Philip Simon Brown, Big Flats, NY (US); Mandakini Kanungo, Ithaca, NY (US); Prantik Mazumder, Ithaca, NY (US); Rajesh Vaddi, Horseheads, NY (US)

(73) Assignee: Corning Incorporated, Corning, NY (US)

(*) Notice: Subject to any disclaimer, the term of this patent is extended or adjusted under 35 U.S.C. 154(b) by 0 days.

(21) Appl. No.: 17/846,320

(22) Filed: Jun. 22, 2022

(65) Prior Publication Data

US 2022/0399242 A1    Dec. 15, 2022

Related U.S. Application Data

(62) Division of application No. 17/217,027, filed on Mar. 30, 2021, now Pat. No. 11,456,225.

(Continued)

(51) Int. Cl.
*H01L 23/15* (2006.01)
*C23C 26/00* (2006.01)
(Continued)

(52) U.S. Cl.
CPC .............. *H01L 23/15* (2013.01); *C23C 26/00* (2013.01); *H01L 21/481* (2013.01); *H01L 23/49827* (2013.01); *H01L 23/49894* (2013.01)

(58) Field of Classification Search
CPC ...................................................... H01L 23/15
See application file for complete search history.

(56) References Cited

U.S. PATENT DOCUMENTS

| 6,077,780 A | 6/2000 | Dubin |
| 8,673,779 B1 | 3/2014 | Yoon et al. |

(Continued)

FOREIGN PATENT DOCUMENTS

| CN | 105448809 A | 3/2016 |
| EP | 2672520 A1 | 12/2013 |
| WO | 2011/050073 A1 | 4/2011 |

OTHER PUBLICATIONS

International Search Report and Written Opinion of the International Searching Authority; PCT/US2021/024608; dated Jul. 8, 2021; 11 pages; European Patent Office.

(Continued)

*Primary Examiner* — Sherman Ng
(74) *Attorney, Agent, or Firm* — Kevin L. Bray

(57) ABSTRACT

A method of manufacturing a glass article comprises: (A) forming a first layer of catalyst metal on a glass substrate; (B) heating the glass substrate; (C) forming a second layer of an alloy of a first metal and a second metal on the first layer; (D) heating the glass substrate, thereby forming a glass article comprising: (i) the glass substrate; (ii) an oxide of the first metal covalently bonded thereto; and (iii) a metallic region bonded to the oxide, the metallic region comprising the catalyst, first, and second metals. In embodiments, the method further comprises (E) forming a third layer of a primary metal on the metallic region; and (F)

(Continued)

heating the glass article thereby forming the glass article comprising: (i) the oxide of the first metal covalently bonded the glass substrate; and (ii) a new metallic region bonded to the oxide comprising the catalyst, first, second, and primary metals.

12 Claims, 13 Drawing Sheets

Related U.S. Application Data

(60) Provisional application No. 63/009,708, filed on Apr. 14, 2020.

(51) Int. Cl.
*H01L 21/48* (2006.01)
*H01L 23/498* (2006.01)

(56) References Cited

U.S. PATENT DOCUMENTS

| | | |
|---|---|---|
| 2013/0240484 A1 | 9/2013 | Kolics |
| 2014/0127899 A1 | 5/2014 | Cabral et al. |
| 2016/0208387 A1 | 7/2016 | Liu et al. |
| 2016/0237571 A1 | 8/2016 | Liu et al. |
| 2019/0363010 A1* | 11/2019 | Brown ................ C03C 17/3607 |
| 2020/0013708 A1* | 1/2020 | Nakabayashi .......... H01L 24/16 |

OTHER PUBLICATIONS

Timothy et al., "Adhesion and reliability of direct Cu metallization of through-package vias in glass interposers" IEEE 64TH Electronic Components And Technology Conference (ECTC), 2014, pp. 2266-2270.

Yoshiki et al., "Electroless Copper Plating Using ZNO Thin Film Coated On A Glass Substrate" Journal Of The Electrochemical Society, vol. 141, No. 5, 1994, pp. L56-L58.

* cited by examiner

METHOD OF MANUFACTURING A GLASS ARTICLE TO PROVIDE INCREASED BONDING OF METAL TO A GLASS SUBSTRATE VIA THE GENERATION OF A METAL OXIDE LAYER, AND GLASS ARTICLES SUCH AS GLASS INTERPOSERS INCLUDING THE METAL OXIDE LAYER

This application is a division of U.S. patent application Ser. No. 17/217,027, filed Mar. 30, 2021, which claims priority under 35 USC § 119(e) from U.S. Provisional Patent Application Ser. No. 63/009,708, filed on Apr. 14, 2020, the contents of each of which is incorporated by reference herein in its entirety.

BACKGROUND

Semiconductor packaging technologies have evolved in significant ways over the years. Early on, the approach to packaging higher complexity semiconductor circuits (and therefore achieving higher functionality and performance in a given package) was to increase the size of a semiconductor chip in two dimensions within the package. As a practical matter, one cannot expand laterally in two dimensions without bound because eventually the design will suffer in terms of power and signal routing complexities, power dissipation problems, performance problems, manufacturing yield problems, etc.

As a result, there have been efforts to expand semiconductor chips vertically. Among those efforts include so-called two-and-a-half-dimensional (2.5D) and three-dimensional (3D) integration, whereby an interposer is employed to interconnect two or more semiconductor chips within a single package. As used herein, the term "interposer" generally refers to any structure that extends or completes the electrical connection between two or more electronic devices. The primary function of the interposer is to provide interconnectivity in such a way that the two or more semiconductor chips may employ high terminal pitch and avoid the need for vias through the semiconductor chips themselves. The technique involves flipping the semiconductor chips over from their usual configuration and orienting the chip substrates up and chip-sides down. The chips are provided with micro-bump terminals (at high pitch), which are connected to corresponding terminals on a top side of the interposer. The opposite, bottom side of the interposer is connected to the package substrate (which is typically organic) by way of suitable terminals, usually Controlled Collapse Chip Connection (C4) joints. The interposer is provided with through-substrate vias ("through-vias") so that electrical connections may be made from the terminals of the semiconductor chips on the top side of the interposer to the terminals of the package substrate at the bottom side of the interposer.

Heretofore, the base substrate for the interposer has typically been silicon. Metallized through-vias provide a path through the interposer for electrical signals to pass between opposite sides of the interposer. While the silicon interposer is a promising and useful technology to achieve vertical integration of semiconductor chips, silicon interposers present problems, particularly in terms of mismatches in coefficients of thermal expansion (CTEs) through the stack, including CTE match-up between the silicon interposer and the organic package substrate. Undesirable CTE mismatches may result in failures in the interconnections between the semiconductor chips and the silicon interposer and/or failures in the interconnections between the silicon interposer and the package substrate. In addition, silicon interposers are relatively expensive and suffer from high dielectric loss due to the semiconducting property of silicon.

Organic interposers (e.g., Flame Retardant 4 (FR4)) have also been introduced. However, organic interposers present problems in terms of dimensional stability.

Glass as the base substrate of the interposer would solve many of the problems that silicon and organic interposers present. Glass is a substrate material that is highly advantageous for electrical signal transmission, because glass has good dimensional stability, a tunable coefficient of thermal expansion ("CTE"), low electrical loss at high frequencies, high thermal stability, and an ability to be formed at thickness and at large panel sizes.

However, there is a problem in that metallization of the through-vias of glass substrates, to provide the electrically conductive pathway, has heretofore proven difficult. Some conductive metals (particularly copper) do not adhere well to glass, including the primary planar surfaces and the sidewall surface of the vias. Without being bound by theory, it is suspected that the poor bonding of the conductive metal to glass is a consequence of the difference in the type of bonds that hold metal together on one hand and glass together on the other. Glass, stated simply, is a network of covalently bonded oxide molecules (such as silicon dioxide, aluminum oxide, and boron oxide). Metal consists of a "sea" of electrons that move freely throughout a lattice of stationary cationic atomic nuclei. The bonding mechanism of glass is fundamentally different from the bonding mechanism of metal and therefore limits adhesion between metals and glass. This problem can be alleviated by roughening the glass surface to which the metal is to be bonded, which provides for mechanical interlocking between the metal and the glass. However, roughening glass surfaces can cause additional problems that make that approach less than ideal. Accordingly, a new approach to solving the problem of metallizing the through-vias of glass substrates intended to be used as interposers, and adhering metal to glass substrates in general, is needed.

SUMMARY

The present disclosure solves both those problems by electroless plating the surface of the glass substrate in a solution that includes a salt of a first metal that readily forms an oxide at the surface (creating a covalent bond with the oxide-rich glass substrate) and a salt of a second metal (such as copper) that less readily forms such an oxide. After a heat treatment, a glass article is formed with the oxide of the first metal covalently bonded to the surface of the glass substrate and a metallic region (including the first metal and the second metal in metallic form) bonded to the oxide of the first metal. A thicker layer of the second metal (or some other metal) can then be electroplated over the metallic region of the glass article. After another heat treatment, the glass article is formed with the oxide of the first metal still covalently bonded to the surface of the glass substrate and the metallic region including the first metal and the second metal in metallic form bonded to the oxide of the first metal. The first metal that readily forms an oxide at the surface acts as a bonding bridge between the oxide-rich glass substrate and the second metal desired to be bonded to the glass substrate. As an example, the first metal is manganese and the second metal is copper. A nanolayer of metal (such as silver) can be first applied to the surface of the glass substrate through a solution-based process (such as spin-coating) to catalyze the electroless deposition of the first metal and the second metal.

According to a first aspect of the present disclosure, a method of manufacturing a glass article comprises: (A) forming a first layer of a catalyst metal on a surface of a glass substrate; (B) subjecting the glass substrate with the first layer of the catalyst metal to a temperature of 150° C. to 600° C. for at least 2 minutes; (C) forming a second layer of an alloy of a first metal and a second metal on the first layer; and (D) subjecting the glass substrate with the second layer of the alloy of the first metal and the second metal on the first layer of the catalyst metal to a temperature of 250° C. to 600° C. for at least 30 minutes, thereby forming the glass article comprising: (i) the glass substrate; (ii) an oxide of the first metal covalently bonded to the glass substrate; and (iii) a metallic region bonded to the oxide of the first metal, the metallic region comprising the catalyst metal in elemental form, the first metal in elemental form, and the second metal in elemental form.

According to a second aspect of the present disclosure, the method of the first aspect further comprises: forming a third layer of a primary metal on the metallic region of the glass article.

According to a third aspect of the present disclosure, the method of the first aspect further comprises: subjecting the glass article with the third layer of the primary metal to a temperature of 250° C. to 600° C. in an inert environment for at least 30 minutes thereby forming the glass article comprising: (i) the glass substrate; (ii) an oxide of the first metal covalently bonded to the glass substrate; and (iii) a new metallic region comprising the catalyst metal, the first metal in elemental form, second metal in elemental form, and the primary metal in elemental form.

According to a fourth aspect of the present disclosure, any one of the first through third aspects, wherein the catalyst metal comprises one or more of silver, gold, cobalt, cobalt-phosphorous, nickel, or nickel-phosphorous, palladium, and platinum.

According to a fifth aspect of the present disclosure, any one of the first through fourth aspects, wherein forming the first layer of the catalyst metal on the surface comprises: contacting the surface with a suspension comprising nanoparticles of the catalyst metal dispersed in a liquid carrier; and evaporating the liquid carrier.

According to a sixth aspect of the present disclosure, the fifth aspect, wherein contacting the surface with the suspension comprises spin-coating the suspension onto the surface.

According to a seventh aspect of the present disclosure, any one of the first through sixth aspects, wherein the glass substrate comprises a first surface and a second surface as primary surfaces of the glass substrate, and a sidewall surface defining a through-via open at the first surface and the second surface and extending through the glass substrate; and the oxide of the first metal is covalently bonded to the sidewall surface of the through-via.

According to an eighth aspect of the present disclosure the third aspect, wherein the glass substrate comprises a first surface and a second surface as primary surfaces of the glass substrate, and a sidewall surface defining a through-via open at the first surface and the second surface and extending through the glass substrate; the oxide of the first metal is covalently bonded to the sidewall surface of the through-via; and the new metallic region forms an electrically conductive path through the though-via.

According to a ninth aspect of the present disclosure, any one of the first through sixth aspects, wherein the glass substrate comprises a first surface and a second surface as primary surfaces of the glass substrate, and a sidewall surface defining a blind-via open at one of the first surface or the second surface and extending partially through the glass substrate; and the oxide of the first metal is covalently bonded to the sidewall surface of the blind-via.

According to a tenth aspect of the present disclosure, any one of the first through ninth aspects, wherein the first metal of the second layer comprises one or more of tantalum, niobium, aluminum, manganese, rhenium, hafnium, chromium, zirconium, titanium, indium, tungsten, magnesium, molybdenum, nickel, and zinc; and the second metal of the second layer comprises one or more of silver, palladium, and copper.

According to an eleventh aspect of the present disclosure, any one of the first through tenth aspects, wherein the oxide of the first metal excludes the second metal.

According to a twelfth aspect of the present disclosure, any one of the first through tenth aspects, wherein the second metal of the second layer is copper.

According to a thirteenth aspect of the present disclosure, any one of the first through twelfth aspects, wherein the first metal of the second layer is manganese or zinc.

According to a fourteenth aspect of the present disclosure, any one of the first through thirteenth aspects, wherein an oxide of the first metal of the alloy has an enthalpy of formation, the absolute value of which is greater than 600 kJ per mole; and an oxide of the second metal of the alloy has an enthalpy of formation, the absolute value of which is less than 600 kJ per mole.

According to a fifteenth aspect of the present disclosure, any one of the first through fourteenth aspects, wherein forming the second layer of the alloy comprises electroless plating the second layer on the first layer using a solution, the solution comprising a salt of the first metal dissolved in the solution, and a salt of the second metal dissolved in the solution.

According to a sixteenth aspect of the present disclosure, the fifteenth aspect, wherein the solution further comprises formaldehyde and a pH greater than 11.

According to a seventeenth aspect of the present disclosure, the fifteenth aspect, wherein the solution further comprises dimethylamine borane and a pH of 6 to 8.

According to an eighteenth aspect of the present disclosure, any one of the first through seventeenth aspects, wherein subjecting the glass substrate with the second layer of the alloy of the first metal and the second metal on the first layer of the catalyst metal to the temperature of 250° C. to 600° C. comprises increasing the temperature at a rate of 1° C. per minute or less.

According to a nineteenth aspect of the present disclosure, anyone of the first through eighteenth aspects, wherein subjecting the glass substrate with the second layer of the alloy of the first metal and the second metal on the first layer of the catalyst metal to the temperature of 250° C. to 600° C. is performed with the glass substrate in the presence of air; and the method further comprises, after subjecting the glass article to the temperature of 375° C. to 425° C., subjecting the glass article to a temperature of 225° C. to 275° C. for at least 30 minutes with the glass article in the presence of forming gas.

According to a twentieth aspect of the president disclosure, the second aspect, wherein the primary metal comprises one or more of silver, gold, cadmium, chromium, copper, nickel, lead, platinum, and tin.

According to a twenty-first aspect of the present disclosure, the second aspect, wherein the primary metal comprises one or more of silver, gold, cadmium, chromium, copper, nickel, lead, platinum, and tin.

According to a twenty-second aspect of the present disclosure, any one of the second, twentieth, and twenty-first aspects, wherein the third layer has a thickness of 2 µm to 5 µm.

According to a twenty-third aspect of the present disclosure, anyone of the second and twentieth through twenty-second aspects, wherein forming the third layer of the primary metal on the metallic region of the glass article comprises electroplating the third layer of the primary metal onto the metallic region of the glass article.

According to a twenty-fourth aspect of the present disclosure, the twenty-third aspect, wherein electroplating utilizes a plating solution that comprises copper sulfate.

According to a twenty-fifth aspect of the present disclosure, any one of the first through twenty-fourth aspects, wherein subjecting the glass substrate with the first layer of the catalyst metal to a temperature of 150° C. to 600° C. for at least 2 minutes comprises: subjecting the glass substrate with the first layer of the catalyst metal to a temperature of 325° C. to 375° C. for at least 2 minutes; and subjecting the glass substrate with the second layer of the alloy of the first metal and the second metal on the first layer of the catalyst metal to a temperature of 250° C. to 600° C. for at least 30 minutes comprises: subjecting the glass substrate with the second layer of the alloy of the first metal and the second metal on the first layer of the catalyst metal to a temperature of 300° C. to 425° C. for at least 30 minutes.

According to a twenty-sixth aspect of the present disclosure, the third aspect, wherein subjecting the glass substrate with the first layer of the catalyst metal to a temperature of 150° C. to 600° C. for at least 2 minutes comprises: subjecting the glass substrate with the first layer of the catalyst metal to a temperature of 325° C. to 375° C. for at least 2 minutes; subjecting the glass substrate with the second layer of the alloy of the first metal and the second metal on the first layer of the catalyst metal to a temperature of 250° C. to 600° C. for at least 30 minutes comprises: subjecting the glass substrate with the second layer of the alloy of the first metal and the second metal on the first layer of the catalyst metal to a temperature of 300° C. to 425° C. for at least 30 minutes; and subjecting the glass article with the third layer of the primary metal to a temperature of 250° C. to 600° C. in an inert environment for at least 30 minutes comprises: subjecting the glass article with the third layer of the primary metal to a temperature of 300° C. to 400° C. in an inert environment for at least 30 minutes.

According to a twenty-seventh aspect of the present disclosure, the third or twenty-sixth aspect, wherein the inert environment is a reduced pressure environment.

According to a twenty-eighth aspect of the present disclosure, a glass interposer comprises: a glass substrate comprising a first surface and a second surface as primary surfaces of the glass substrate, and a through-via extending through a thickness of the glass substrate from the first surface to the second surface, the through-via having a sidewall surface and a central axis; a metallic region disposed within the through-via about the central axis; and an oxide of a first metal covalently bonded to the sidewall surface of the through-via, the oxide of the first metal disposed between the sidewall surface and the metallic region, the metallic region comprising the first metal in elemental form and a second metal in elemental form.

According to a twenty-ninth aspect of the present disclosure, the twenty-eighth aspect, wherein the first metal is one or more of tantalum, niobium, aluminum, manganese, rhenium, hafnium, chromium, zirconium, titanium, indium, tungsten, magnesium, molybdenum, nickel, and zinc; and the second metal is one or more of silver, palladium, and copper.

According to a thirtieth aspect of the present disclosure, the twenty-eighth aspect, wherein the oxide of the first metal has an enthalpy of formation, the absolute value of which is greater than 325 kJ per mole; and an oxide of the second metal has an enthalpy of formation, the absolute value of which is less than 175 kJ per mole.

According to a thirty-first aspect of the present disclosure, the twenty-eighth aspect, wherein the first metal is manganese, and the second metal is copper.

According to a thirty-second aspect of the present disclosure, any one of the twenty-eighth through thirty-first aspects, wherein the metallic region further comprises silver.

Additional features and advantages will be set forth in the detailed description which follows, and in part will be readily apparent to those skilled in the art from that description or recognized by practicing the embodiments as described herein, including the detailed description and the claims, which follow.

It is to be understood that both the foregoing general description and the following detailed description are merely exemplary, and are intended to provide an overview or framework to understanding the nature and character of the claims.

DETAILED DESCRIPTION

Figure 1:
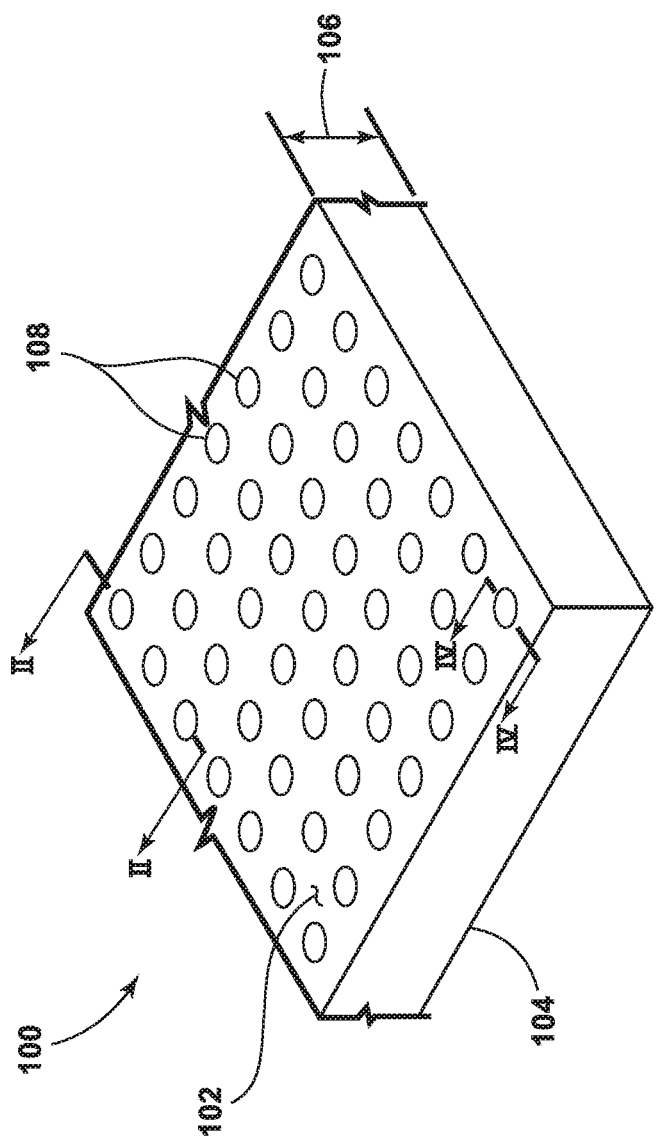
FIG. 1 is a perspective view of a glass substrate for use as an interposer, illustrating vias extending through a thickness of the glass substrate from a first surface to a second surface.

Reference will now be made in detail to the present preferred embodiments, examples of which are illustrated in the accompanying drawings. Whenever possible, the same reference numerals will be used throughout the drawings to refer to the same or like parts.

Glass Substrate

Figure 2:
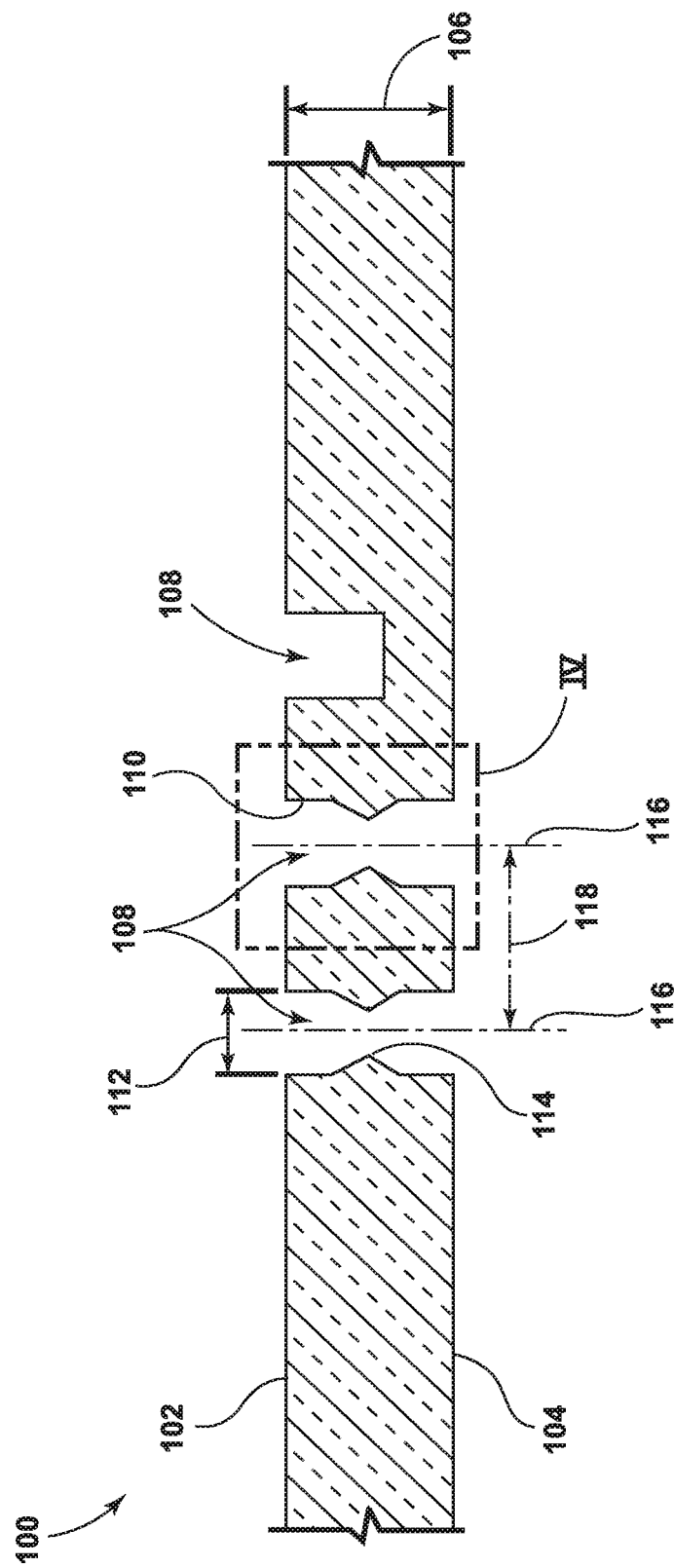
FIG. 2 is an elevational cross-sectional view of the glass substrate of FIG. 1 taken through the line II-II of FIG. 1, illustrating each of the vias having a central axis orthogonal to the first surface and the second surface and a sidewall surface defining the via.
Figure 3:
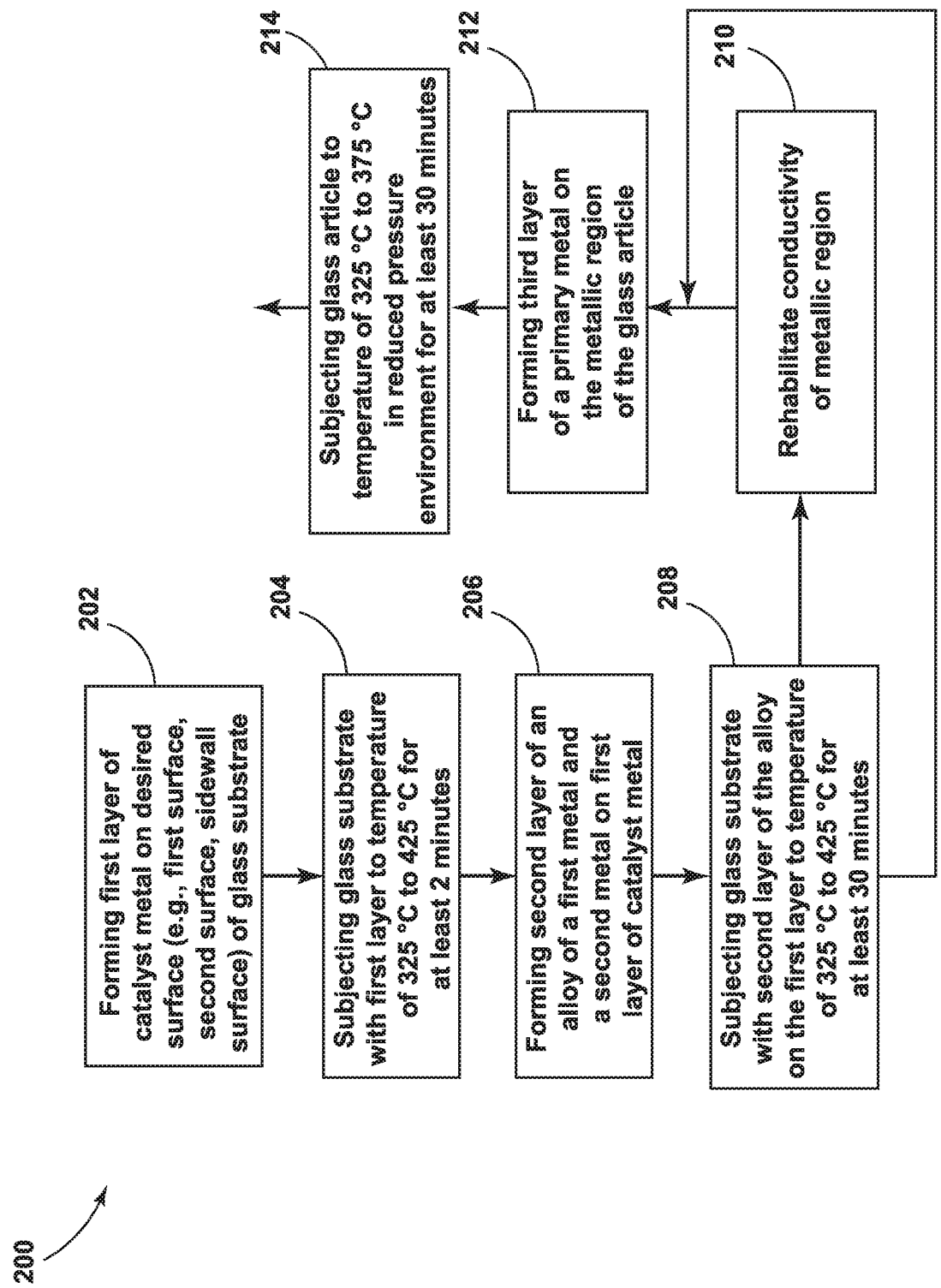
FIG. 3 is a flow chart of a method of manufacturing a glass article, such as an interposer, illustrating various steps forming metal layers and heat treating those metal layers.
Figure 4:
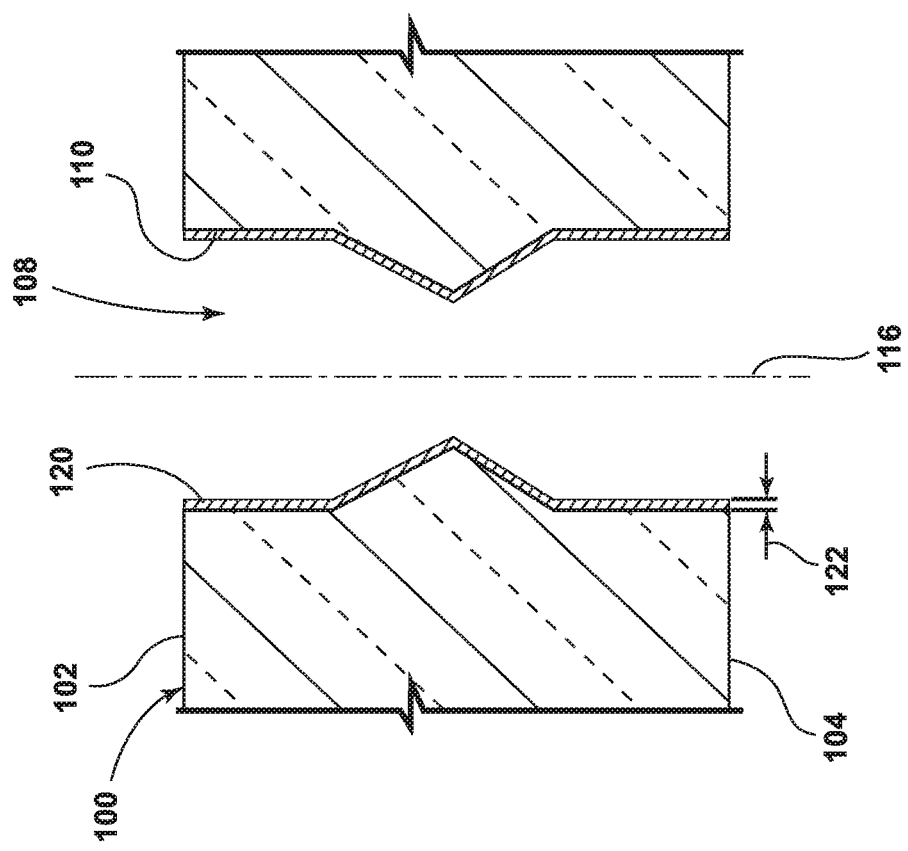
FIG. 4 is an elevational cross-sectional view of the glass substrate of FIG. 1 taken through the line IV-IV of FIG. 1 after a step of the method of FIG. 3, illustrating the formation of a first layer of a catalyst metal on the sidewall surface of the via.
Figure 5:
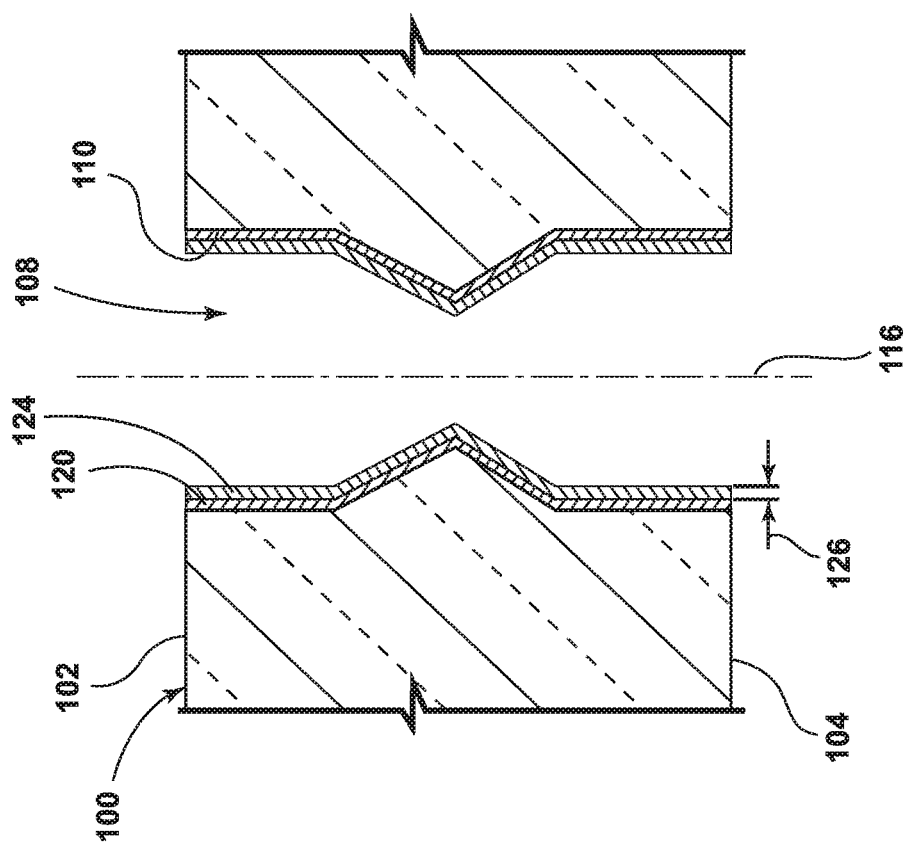
FIG. 5 is the same view as FIG. 4 but after other steps of the method of FIG. 3, illustrating the formation of a second layer of an alloy of a first metal and a second metal on the first layer of the catalyst metal.
Figure 6:
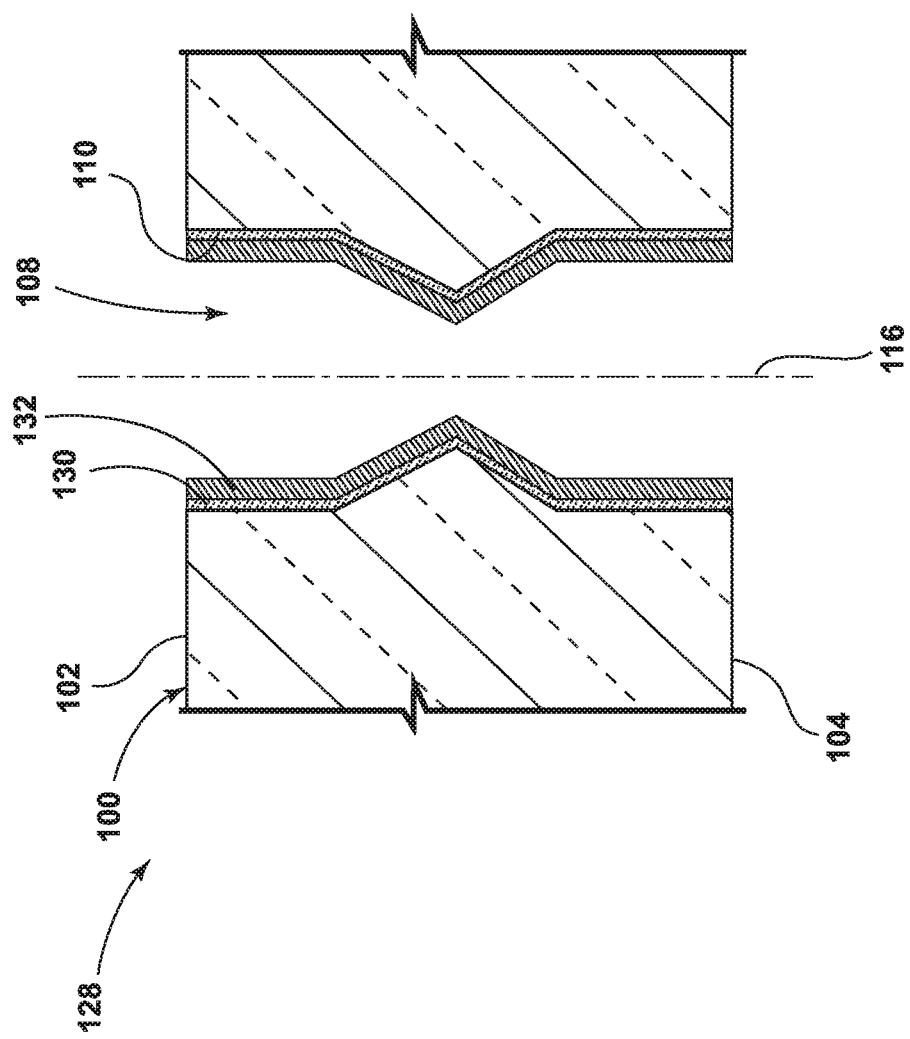
FIG. 6 is the same view as FIG. 5 but after another step of the method of FIG. 3, illustrating the formation of an oxide of the first metal from the second layer bonded to the sidewall surface of the glass substrate, and a metallic region including the first metal, the second metal, and the catalyst metal all in elemental form disposed over the oxide of the first metal.

Referring now to FIGS. 1 and 2, a glass substrate 100, in the form of an interposer, is illustrated. The glass substrate 100 includes a first surface 102 and a second surface 104. In embodiments, the first surface 102 and the second surface 104 are the primary surfaces of the glass substrate 100, are at least approximately parallel, and face in generally opposite directions.

In embodiments, the glass substrate 100 is an alkaline earth aluminoborosilicate glass substrate, an alkali aluminosilicate glass substrate, an alkali aluminoborosilicate glass substrate, or fused silica (including high purity fused silica). In other embodiments, the glass substrate 100 is alkali-free, such as an alkali-free aluminoborosilicate glass substrate or an alkali-free aluminosilicate glass substrate. "Alkali-free" means that the glass substrate 100 contains no purposeful amount of an alkali metal such that any alkali metal in the glass substrate 100 exists as an impurity. In embodiments, the glass substrate 100 has a composition comprising (in mole percent on an oxide basis): $SiO_2$—60 to 78; $Al_2O_3$—6 to 15.

For example, in some embodiments, the glass substrate 100 comprises (in mole percent on an oxide basis): 64.0 to 71.0—$SiO_2$; 9.0 to 12.0—$Al_2O_3$; 7.0 to 12.0—$B_2O_3$; 1.0 to 3.0—MgO; 6.0 to 11.5—CaO; 0 to 2.0—SrO; 0 to 0.1—BaO; and at least 0.01—$SnO_2$; wherein, $1.00 \leq \Sigma[RO]/[Al_2O_3] \leq 1.25$, where $[Al_2O_3]$ is the mole percent of $Al_2O_3$ and $\Sigma[RO]$ equals the sum of the mole percents of MgO, CaO, SrO, and BaO. In such embodiments, the glass substrate 100 can have a coefficient of thermal expansion (CTE) at room temperature of $20 \times 10^{-7}$ to $50 \times 10^{-7}/°$ C., such as $28 \times 10^{-7}/°$ C. to $34 \times 10^{-7}/°$ C., such as about $31.7 \times 10^{-7}/°$ C. "CTE," "coefficient of thermal expansion," and like terms refer to how the size of an object changes with a change in temperature. The CTE measures the fractional change in size per degree change in temperature at a constant pressure, and the size can refer to, for example, volumetric, area, or linear.

In some embodiments, the glass substrate 100 comprises (in mole percent on an oxide basis): 61 to 75—$SiO_2$; 7 to 15—$Al_2O_3$; 0 to 12—$B_2O_3$; 9 to 21—$Na_2O$; 0 to 4—$K_2O$; 0 to 7—MgO; and 0 to 3—CaO.

In some embodiments, the glass substrate 100 comprises (in mole percent on an oxide basis): 60 to 70—$SiO_2$; 6 to 14—$Al_2O_3$; 0 to 15—$B_2O_3$; 0 to 15—$Li_2O$; 0 to 20—$Na_2O$; 0 to 10—$K_2O$; 0 to 8—MgO; 0 to 10—CaO; 0 to 5—$ZrO_2$; 0 to 1—$SnO_2$; 0 to 1—$CeO_2$; less than 50 ppm $As_2O_3$; and less than 50 ppm $Sb_2O_3$; wherein 12 mol $\% \leq Li_2O + Na_2O + K_2O \leq 20$ mol %; and 0 mol $\% \leq MgO + CaO \leq 10$ mol %.

In some embodiments, the glass substrate 100 comprises (in mole percent on an oxide basis): 64 to 68—$SiO_2$; 12 to 16—$Na_2O$; 8 to 12—$Al_2O_3$; 0 to 3—$B_2O_3$; 2 to 5—$K_2O$; 4 to 6—MgO; and 0 to 5—CaO, wherein: 66 mol $\% \leq SiO_2 + B_2O_3 + CaO \leq 69$ mol %; $Na_2O + K_2O + B_2O_3 + MgO + CaO + SrO > 10$ mol %; 5 mol $\% \leq MgO + CaO + SrO \leq 8$ mol %; $(Na_2O + B_2O_3) - Al_2O_3 \leq 2$ mol %; 2 mol $\% \leq Na_2O - Al_2O_3 \leq 6$ mol %; and 4 mol $\% \leq (Na_2O + K_2O) - Al_2O_3 \leq 10$ mol %.

In some embodiments, the glass substrate 100 comprises (in mole percent on an oxide basis): 66 to 78—$SiO_2$; 4 to 11—$Al_2O_3$; 4 to 11—$B_2O_3$; 0 to 2—$Li_2O$; 4 to 12—$Na_2O$; 0 to 2—$K_2O$; 0 to 2—ZnO; 0 to 5—MgO; 0 to 2—CaO; 0 to 5—SrO; 0 to 2—BaO; and 0 to 2—$SnO_2$.

In some embodiments, the glass substrate 100 comprises (in mole percent on an oxide basis): 69.49—$SiO_2$, 8.45—$Al_2O_3$, 14.01—$Na_2O$, 1.16—$K_2O$, 0.185—$SnO_2$, 0.507—CaO, 6.2—MgO, 0.01—$ZrO_2$, and 0.008—$Fe_2O_3$.

In embodiments, the glass substrate 100 is made by a glass manufacturing system that uses a fusion process to fabricate glass sheets, which are then cut into the desired shape of the glass substrate 100. The fusion process forms the glass substrate 100 with an already uniform thickness, such as with a total thickness variation (TTV) of less than 1.0 µm. Accordingly, polishing or other finishing steps may not be required before use of the glass substrate 100 as an interposer. In the event that the fusion process results in a glass sheet that would result in a thickness 106 of the glass substrate 100 being thicker than desired, then the thickness 106 of the glass substrate 100 can be thinned by any known means such as etching and polishing. In still other embodiments, the glass substrate 100 is made with a non-fusion process and then polished or etched to have the desired thickness 106. After the glass substrate 100 is made, the glass substrate 100 may be annealed to reduce residual stresses present in the glass substrate 100.

The thickness 106 of the glass substrate 100, in the illustrated embodiment, extends from the first surface 102 and the second surface 104. In embodiments, the thickness 106 is within the range of 25 µm to about 1 mm, although smaller and larger values for the thickness 106 are envisioned. For example, for the embodiments described herein, the thickness 106 of the glass substrate 100 is about 50 µm, about 100 µm, about 200 µm, about 300 µm, about 400 µm, about 500 µm, about 600 µm, about 700 µm, about 800 µm, about 900 µm, about 1 mm, and any range using those values, such as within the range of 50 µm to 300 µm, and so on. In embodiments, the thickness 106 is within the range of 50 µm to 100 µm. The glass substrate 100 can have any desired shape. In embodiments, the glass substrate 100 has a circular shape. In those embodiments, the glass substrate 100 can have a diameter within the range of 200 mm to 300 mm. In other embodiments, the glass substrate 100 has a square or rectangular shape.

The glass substrate 100 further includes one or more vias 108. In embodiments, the glass substrate 100 includes a plurality of vias 108. In embodiments, some or all of the one or more vias 108 extend through the thickness 106 of the glass substrate 100 from the first surface 102 to the second surface 104. Such vias 108 may be referred to herein as "through-vias." The through-vias 108 are open at the first surface 102 and the second surface 104. In other embodiments, some or all of the one or more vias 108 are open to the first surface 102 but extend only partially through the thickness 106, not extending all the way through the thickness 106 to the second surface 104. Such vias 108 may be referred to herein as "blind vias." In embodiments, the glass substrate 100 includes a plurality of both through-vias 108 and blind vias 108. A sidewall surface 110 defines each via 108 within the thickness 106 of the glass substrate 100.

The vias 108 have a diameter 112. Although the diameters 112 of each via 108 are shown as being the same, such need not be the case, i.e., the diameters 112 of the vias 108 may vary within the same glass substrate 100. In embodiments, the diameter 112 is within the range of from 5 microns to 150 microns. In embodiments, such as the illustrated embodiment, the vias 108 have an hourglass shape with a waist 114 where the diameter 112 of the via 108 is less than the diameter 112 of the via 108 at the first surface 102 and/or second surface 104 of the glass substrate 100. The hourglass shape may be conducive to electroplating, which is further described below. In other embodiments, the vias 108 have a substantially cylindrical or substantially conical shape.

Each via 108 has a central axis 116. The central axis 116 of one via 108 is separated from the central axis 116 of an adjacent via 108 by a pitch 118. The pitch 118 can be any value according to the desired application, such as, without limitation, about 10 μm to about 2000 μm, including about 10 μm, about 25 μm, about 50 μm, about 100 μm, about 250 μm, about 500 μm, about 1000 μm, about 2000 μm, or any value or range between any two of these values (including endpoints). For example, the pitch 118 can be within the range of 10 μm to 100 μm, 25 μm to 500 μm, 10 μm to 1000 μm, or 250 μm to 2000 μm. The pitch 118 on the same glass substrate 100 can be variable or can be consistent. The pitch 118 can be such that there are from 1 to 20 vias 108 per square millimeter, for example, and will depend upon the design and application of the interposer. In embodiments, the vias 108 are patterned throughout the glass substrate 100. In other embodiments, the vias 108 do not form a pattern.

The vias 108 are formed within the glass substrate 100 using one of a variety of forming techniques. For example, the vias 108 can be formed by mechanical drilling, etching, laser ablation, laser assisted processes, laser damage and etching processes, abrasive blasting, abrasive water jetting machining, concentrated electron-thermal energy, or any other suitable forming technique. In the laser damage and etching process, a damage track is initially formed in the glass substrate 100 by using a laser to modify the glass substrate 100 along the damage track. An etching solution is then applied to the glass substrate 100. The glass substrate 100 is thinned by the etching solution. Because the etching rate of the glass substrate 100 is faster at the damage track, the damage track is preferentially etched so that a via 108 is opened through the glass substrate 100.

Method 200 to Metallize the Glass Substrate 100, Such as the Vias 108

Referring now to FIGS. 3-6, the vias 108 of the glass substrate 100 are metallized pursuant to a novel method 200 described herein. Although the method 200 is described in the context of the glass substrate 100 as an interposer and for the purpose of metallizing the vias 108, it should be understood that the method 200 concerns disposing metals onto a glass substrate 100 intended for any purpose, and concerns metallizing surfaces other than the sidewall surface 110 of the vias 108 such as the first surface 102, the second surface 104, and/or other apertures through the glass substrate 100. In the context of the glass substrate 100 for use as an interposer, as mentioned in the background, metallizing the vias 108 provides a conductive path through the interposer for electrical signals to pass from the first surface 102 to the second surface 104.

Forming a First Layer 120 of a Catalyst Metal. At a step 202, the method 200 comprises forming a first layer 120 of a catalyst metal on a surface of the glass substrate 100 (see particularly FIG. 4). In embodiments, the first layer 120 of the catalyst metal may cover all or substantially all of the glass substrate 100. In embodiments, such as the illustrated embodiment, step 202 comprises forming the first layer 120 of the catalyst metal on the sidewall surface 110 of the vias 108 of the glass substrate 100. In other embodiments, step 202 comprises forming the first layer 120 of the catalyst metal on the first surface 102 or the second surface 104, or both the first surface 102 and the second surface 104. Alternatively, the first layer 120 of the catalyst metal may be patterned to cover a portion of the glass substrate 100, such as a portion of the first surface 102, a portion of the second surface 104, a portion or an entirety of the sidewall surface 110 of the vias 108, or some combination thereof. Patterning may be done by selectively masking a region of the glass substrate 100 during the deposition of the first layer 120 of the catalyst metal onto the glass substrate 100, such as with blocking tape or photoresist.

The catalyst metal is a catalyst in the sense that it promotes the deposition of a subsequent layer of metal over the catalyst metal via electroless deposition or other methods. In embodiments, the catalyst metal comprises one or more of silver, gold, cobalt, cobalt-phosphorous, nickel, nickel-phosphorous, palladium, and platinum. In embodiments, the catalyst metal is or consists essentially of silver or palladium. In embodiments, the first layer 120 of the catalyst metal is a nano-layer having a thickness 122 within the range of 5 nm to about 10000 nm, such as within the range of 5 nm to 100 nm.

In embodiments, the first layer 120 of the catalyst metal is or consists essentially of silver, and the step 202 of the method 200 comprises forming the first layer 120 of silver as the catalyst metal on the sidewall surface 110 of the vias 108 of the glass substrate 100.

In embodiments, forming the first layer 120 of the catalyst metal on the sidewall surface 110 of the vias 108 of the glass substrate 100 (or any other desired surface of the glass substrate 100) comprises (i) contacting the sidewall surface 110 of the glass substrate 100 with a suspension of nanoparticles of the catalyst metal dispersed in a liquid carrier; and (ii) evaporating the liquid carrier. The liquid carrier can be water or solvent-based. The solvent-based liquid carrier can be a single solvent, a mixture of solvents, or a solvent (a single solvent or a mixture of solvents) having other non-solvent components. Exemplary solvents that can be utilized include, but are not limited to, a hydrocarbon, a halogenated hydrocarbon, an alcohol, an ether, a ketone, and like substances, or mixtures thereof, such as 2-propanol (also referred to as isopropanol, IPA, or isopropyl alcohol), tetrahydrofuran (THF), ethanol, chloroform, acetone, butanol, octanol, pentane, hexane, heptane, cyclohexane, and mixtures thereof. An example suspension is nanoparticles of the catalyst metal in cyclohexane at a concentration of 10 to 30% (w/v). Evaporation of the liquid carrier leaves the nanoparticles of the catalyst metal upon the sidewall surface 110 of the vias 108 of the glass substrate 100.

The term "nanoparticle" refers to a particle/component with an average diameter (or cross-sectional dimension) along the shortest axis of between about 1 nm and about 10000 nm. It should be understood that particle sizes of nanoparticles can be distributional properties. Further, in some embodiments, the nanoparticles may have different sizes or distributions or more than one size or distribution. Thus, a particular size can refer to an average particle diameter which relates to the distribution of individual particle sizes. In some embodiments, the nanoparticles have an average diameter from about 5 nm to about 10000 nm, from about 5 nm to about 7500 nm, from about 5 nm to about 5000 nm, from about 5 nm to about 2500 nm, from about 5 nm to about 2000 nm, from about 5 nm to about 1500 nm, from about 5 nm to about 1250 nm, from about 5 nm to about 1000 nm, from about 5 nm to about 750 nm, from about 5 nm to about 500 nm, from about 5 nm to about 250 nm, from about 5 nm to about 200 nm, from about 5 nm to about 150 nm, from about 5 nm to about 125 nm, from about 5 nm to about 100 nm, from about 5 nm to about 75 nm, from about 5 nm to about 50 nm, from about 5 nm to about 25 nm, and from about 5 nm to about 20 nm, and 8 nm to 15 nm, such as about 5 nm, 10 nm, 20 nm, 25 nm, 50 nm, 75 nm, 100 nm, 125 nm, 150 nm, 175 nm, 200 nm, 250 nm, 300 nm, 400 nm, 500 nm, 600 nm, 700 nm, 750 nm, 800 nm, 900 nm, 1000 nm, 1250 nm, 1500 nm, 2000 nm, 2500 nm, 5000 nm, 7500 nm, or 10000 nm. The size of the nanoparticles can be measured by a variety of methods such as dynamic light scattering techniques or with a transmission electron microscope (TEM). For example, as understood in the art, particle size distributions are often calculated via TEM image analysis of a sample consisting of hundreds of different nanoparticles.

Nanoparticles may have any shape and surface features. The structure and geometry of a nanoparticle can vary and the present disclosure is not intended to be limited to any particular geometry and/or structure. Embodiments herein comprise a plurality of nanoparticles and each individual nanoparticle or group of nanoparticles can have either the same or different structure and/or geometry than other nanoparticles. For example, in some embodiments, nanoparticles may be spherical, oblong, polyhedral, flakes, or take on crystalline-type structures. In some embodiments, nanoparticle surfaces may be smooth, rough, ordered, disordered, or patterned.

In embodiments, the nanoparticles of metal are nanoparticles of silver. In some embodiments, the silver nanoparticles have an average diameter of 10 nm to 13 nm, and are dispersed in cyclohexane at a concentration of 20 percent (w/v) (commercially available from Cerion, LLC (Rochester, N.Y., USA)).

Before contacting the glass substrate 100 with the suspension of nanoparticles, the suspension of nanoparticles is optionally ultra-sonicated to promote dispersion of the nanoparticles throughout the liquid carrier. For example, the suspension of nanoparticles can be ultra-sonicated for a time period within the range of 15 minutes to 45 minutes, such as about 30 minutes.

As mentioned, the first layer 120 of the catalyst metal is a nano-layer having a thickness within the range of 5 nm to about 10000 nm, such as within the range of 5 nm to 100 nm. The first layer 120 may comprise less than a monolayer, a monolayer, or multiple monolayers of the nanoparticles. In embodiments, the first 120 of the catalyst metal is not uniform but rather single particles or clusters of particles on the on the sidewall surface 110 of the vias 108 of the glass substrate 100 (or first surface 102, second surface 104, as the case may be), with portions of the sidewall surface 110 left exposed.

In embodiments, contacting the desired surface (e.g., first surface 102, second surface 104, sidewall surface 110) of the glass substrate 100 with a suspension of nanoparticles of the catalyst metal comprises spin-coating the suspension onto the surface of the glass substrate 100. The spin-coating can be performed at any speed and for any time period found adequate to form the desired nanoparticulate layer of the nanoparticles of the catalyst metal on the glass substrate 100. For example, the suspension of nanoparticles can be deposited onto the glass substrate 100 rotating at 1000 to 5000 rpm (e.g., 1000, 2000, 3000, 4000, or 5000 rpm), for a time period of about 30 seconds, or less than 30 seconds, or more than 30 seconds.

In embodiments, contacting the desired surface (e.g., first surface 102, second surface 104, sidewall surface 110) of the glass substrate 100 with a suspension of nanoparticles of the catalyst metal comprises dip-coating the desired surface of the glass substrate 100 in the suspension of nanoparticles or spray coating the surface of the glass substrate 100 with the suspension of nanoparticles. The dip-coating can be performed at a withdrawal speed (sometimes referred to as a pull rate) (e.g., 30 to 35 mm per minute) appropriate to form the first layer 120 of the catalyst metal on the surface of the glass substrate 100.

Such solution-based processes to form the first layer 120 of the catalyst metal on the surface (e.g., first surface 102, second surface 104, sidewall surface 110) of the glass substrate 100 are an improvement over processes that are not solution-based such as vacuum deposition. The solution-based processes of spin-coating and dip-coating described above are less expensive than vacuum deposition. In addition, those solution-based processes are able to form the first layer 120 of the catalyst metal on the sidewall surface 110 of the vias 108, while vacuum deposition is less likely to completely cover the sidewall surfaces 110 of the vias 108 with the first layer 120 as the aspect ratio of the vias 108 increases.

Heat Treating the Glass Substrate 100 With the First layer 120 of the Catalyst Metal. At a step 204, the method 200 further comprises subjecting the glass substrate 100 with the first layer 120 of the catalyst metal to a temperature of 150° C. to 600° C. for a time period of at least 2 minutes. In embodiments, the temperature is 250° C. to 400° C., such as about 325° C. to 375° C., such as about 350° C. or 350° C. In embodiments, the time period is 2 to 5 minutes. The step 204 may be referred to herein as "heat treating" the glass substrate 100 with the deposited first layer 120 of the catalyst metal. If the first layer 120 of the catalyst metal is susceptible to oxidation, then the step 204 can be performed in an inert atmosphere (e.g., nitrogen gas atmosphere) or, if not, a subsequent heat treatment in a reducing atmosphere (e.g., hydrogen gas atmosphere) can be performed to reduce the oxidized catalyst metal back to elemental form. An oxidized first layer 120 of the catalyst metal can inhibit further application of a second layer of metal later in the method 200 (discussed below). In embodiments where the first layer 120 of the catalyst metal is silver, silver is not prone to oxidize in the presence of air during the heat treatment step 204 of the method 200. In embodiments, the glass substrate 100 is subjected to room temperature and then subjected to increasing temperatures at a certain ramp up rate (such as a ramp up rate within the range of 0.5° C. per minute to 10° C. per minute). In other embodiments, the glass substrate 100 with the first layer 120 of the catalyst metal is placed directly into a pre-heated furnace set to a pre-determined temperature within the operable range of the step 204. The step 204 can be performed by placing the glass substrate 100 with the first layer 120 of the catalyst metal in a vertical furnace, a tube furnace, a rapid thermal annealer (RTA), on a hot-plate, and so on. In embodiments where palladium is utilized as the catalyst metal for the first layer 120, step 204 can be omitted—that is, the method 200 need not include step 204.

Forming a Second Layer 124 of an Alloy on the First layer 120. At a step 206, the method 200 further comprises forming a second layer 124 of an alloy of a first metal and a second metal on the first layer 120. In embodiments where the first layer 120 is not uniform and leaves portions of the sidewall surface 100 exposed, the second layer 124 of the alloy of the first metal and the second metal is formed on the first layer 120 and the exposed sidewall surface 100. In embodiments, as in the illustrated embodiment, where the first layer 120 was formed on the sidewall surface 110, the second layer 124 is formed closer to the central axis 116 than the first layer 120 but does not close off the via 108. The step 206 occurs after the heat treatment step 204. The first metal has a greater propensity to form an oxide that forms a covalent bond with the desired surface (e.g., sidewall surface 110 of the vias 108, etc.) of the glass substrate 100 than the second metal. The enthalpy of formation of such an oxide is one quantification of the propensity. In embodiments, the absolute value of the enthalpy of formation of an oxide of the first metal is greater than the absolute value of the enthalpy of formation of an oxide of the second metal. In embodiments, the absolute value of the enthalpy of formation of an oxide of the first metal is greater than 600 kJ per mole, while the absolute value of the enthalpy of formation of an oxide of the second metal is less than 600 kJ per mole. In embodiments, the absolute value of the enthalpy of formation of an oxide of the first metal is greater than 325 kJ per mole, while the absolute value of the enthalpy of formation of an oxide of the second metal is less than 175 kJ per mole. In embodiments, the absolute value of the enthalpy of formation of an oxide of the first metal is greater than 900 kJ per mole, while the absolute value of the enthalpy of formation of an oxide of the second metal is less than 175 kJ per mole. In embodiments, the first metal of the second layer 124 comprises one or more of tantalum, niobium, aluminum, manganese, rhenium, hafnium, chromium, zirconium, titanium, indium, tungsten, magnesium, molybdenum, nickel, and zinc; and the second metal of the second layer 124 comprises one or more of silver, palladium, and copper. In embodiments, the first metal of the second layer 124 is manganese or zinc; and the second metal of the second layer 124 is copper. Table 1 below lists the enthalpy of formation for various oxides of various metals.

TABLE 1

| Metal Oxide | Enthalpy of Formation (kJ per mole) |
| --- | --- |
| $Ag_2O$ | −31.1 |
| PdO | −85.4 |
| CuO | −157.3 |

TABLE 1-continued

| Metal Oxide | Enthalpy of Formation (kJ per mole) |
| --- | --- |
| $Cu_2O$ | −168.6 |
| $RuO_4$ | −239.3 |
| SnO | −280.71 |
| $Rh_2O_3$ | −343.0 |
| ZnO | −350.5 |
| MnO | −384.9 |
| $Ni_2O_3$ | −489.5 |
| $MnO_2$ | −520 |
| $MoO_2$ | −591.50 |
| MgO | −601.6 |
| $WO_3$ | −842.91 |
| $SiO_2$ | −910.7 |
| $In_2O_3$ | −925.8 |
| $TiO_2$ | −944 |
| $Mn_2O_3$ | −971 |
| $ZrO_2$ | −1094.3 |
| $Cr_2O_3$ | −1139.7 |
| $HfO_2$ | −1144.7 |
| $Re_2O_7$ | −1240.1 |
| $Mn_3O_4$ | −1387 |
| $Al_2O_3$ | −1675.5 |
| $Nb_2O_5$ | −1899.5 |
| $Ta_2O_5$ | −2046 |

In embodiments, the step 206 of forming the second layer 124 of the alloy of the first metal and the second metal on the first layer 120 comprises electroless plating the second layer 124 on the first layer 120 using a solution that includes (i) a salt of the first metal dissolved in the solution, and (ii) a salt of the second metal dissolved in the solution. In electroless plating, an ionic compound of a cation of the first metal and an anion, and an ionic compound of a cation of the second metal and an anion, are reduced to the first metal and the second metal in elemental form by means of a chemical reducing agent. A typical electroless plating process involves: (a) a plating solution of the ionic compounds including cations of the first metal and the second metal; (b) a reducing agent; (c) a pH-adjusting agent; (d) a complexing agent to solubilize the ionic compounds; and (e) special additives to control the solution stability and plating rate. These solutions are deposited on the glass article with the first layer 120 of the catalyst metal providing a catalytically active surface. This catalytically active surface catalyzes the reduction of the metal cations of the ionic compounds and results in the simultaneous deposition of the first metal and the second metal in elemental form on the first layer 120 of the glass article (e.g., within the vias 108) thus forming an alloy of the first metal and the second metal as the second layer 124. The second layer 124 is autocatalytic and, thus, catalyzes further reaction and deposition of additional first and second metals in elemental form onto the second layer 124 thus growing the thickness thereof.

As mentioned, the electroless plating process includes the plating solution with ionic compounds of the first metal and the second metal dissolved in a solvent. Suitable ionic compounds include, for example, nitrates, sulfates, chlorides, acetates, and cyanides of the first metal and the second metal. An example plating solution includes manganese sulfate monohydrate as the ionic compound of the first metal, and copper sulfate pentahydrate as the ionic compound of the second metal. Another example plating solution includes zinc chloride as the ionic compound of the first metal, and copper sulfate pentahydrate as the ionic compound of the second metal. Typically, the ionic compounds are present in the solution at concentrations in the range of about 0.001 mM to about 25 mM. In embodiments, the ratio of the concentration of the ionic compound of the first metal to the concentration of the ionic compound of the second metal is within the range of 1:20000 to 1:1, such as 1:20 to 1:3, including about 1:4 or 1:4. The solvent can be aqueous or it can be an organic liquid as appropriate for the ionic compound. Such organic liquids can include, for example, alcohols, ethers, ketones, alkanes, and the like.

As mentioned, the electroless plating process includes the reducing agent, the pH-adjusting agent, and the complexing agent. The reducing agent reduces cations of the metal present on the first layer 120 of the glass substrate 100. Specific examples of the reducing agent include $NaBH_4$, $KBH_4$, $NaH_2PO_2$, hydrazine, formalin, formaldehyde, dimethylamine borane ("DMAB") and polysaccharides (e.g., glucose). The pH-adjusting agent adjusts the pH of the plating solution, and may be an acidic or basic compound. In embodiments that use formaldehyde as the reducing agent, the pH-adjusting agent can be utilized to adjust the pH of the solution to 11 or more. In embodiments that use DMAB as the reducing agent, the pH-adjusting agent can be utilized to adjust the pH of the solution to be approximately neutral (pH of about 7, such as 6 to 8).

The complexing agent helps prevent precipitation of hydroxides in an alkaline solution and to control the concentration of the cations of the first metal and the second metal, thereby preventing the decomposition of the ionic compounds and adjusting the plating speed. Specific examples of the complexing agent include ammonia solution, acetic acid, guanic acid, tartaric acid, chelating agents (e.g., ethylenediamine tetraacetic acid (EDTA)), Rocehelle salt (potassium sodium tartrate tetrahydrate), and organic amine compounds.

In embodiments, the plating solution has a temperature within the range of 30° C. to 70° C., such as about 60° C. In embodiments, the glass substrate 100 is subjected to the electroless plating process for a time period within the range of 20 seconds to 30 minutes, such as about 20 minutes. In embodiments, the second layer 124 of metal formed from the electroless plating has a thickness 126 within the range of 10 nm to 100 nm, such as about 50 nm. The second layer 124 of metal should be sufficiently thick to ensure sufficient conductivity to allow for subsequent application of a third layer of metal as described below.

Heat Treating the Glass Substrate 100 with the Second layer 124. At a step 208, the method 200 further comprises subjecting the glass substrate 100 with the second layer 124 of the alloy of the first metal and the second metal on the first layer 120 of the catalyst metal to a temperature of 250° C. to 600° C. for at least 30 minutes. In embodiments, the temperature is 300° C. to 450° C., such as 375° C. to 425° C., such as about 400° C. or 400° C. The heat treatment forms a glass article 128 (see FIG. 6) comprising: (i) the glass substrate 100; (ii) an oxide 130 of the first metal covalently bonded to the glass substrate 100; and (iii) a metallic region 132 bonded to the oxide 130 of the first metal. In embodiments, the oxide 130 of the first metal excludes the second metal. The metallic region 132 includes the catalyst metal in elemental form, the first metal in elemental form, and the second metal in elemental form. During the heat treatment of the step 208, the first metal from the second layer 124 forms an oxide 130 that bonds to the surface of the glass substrate 100 replacing the first layer 120 of the catalyst metal.

In embodiments, the temperature of the environment around the glass substrate 100 for the step 208 is increased to the temperature at a rate of 5° C. per minute or less, such as 1° C. per minute or less.

In embodiments, the heat treatment step 208 is performed with the glass substrate 100 in the presence of air. The presence of air may assist in the formation of the oxide 130 of the first metal that bonds to the sidewall surface 110 of the glass substrate 100. In such embodiments, the method 200 further comprises a heat treatment reducing step 210 of subjecting the glass article 128 resulting from step 208 to a temperature of 225° C. to 275° C. for at least 30 minutes (e.g., 30 to 90 minutes) with the glass article 128 in the presence of forming gas (mixture of $H_2$ and $N_2$). The reducing step 210 rehabilitates the conductivity of the metallic region 132 to allow for subsequent application of the third layer of metal over the metallic region 132, as discussed below.

Figure 7:
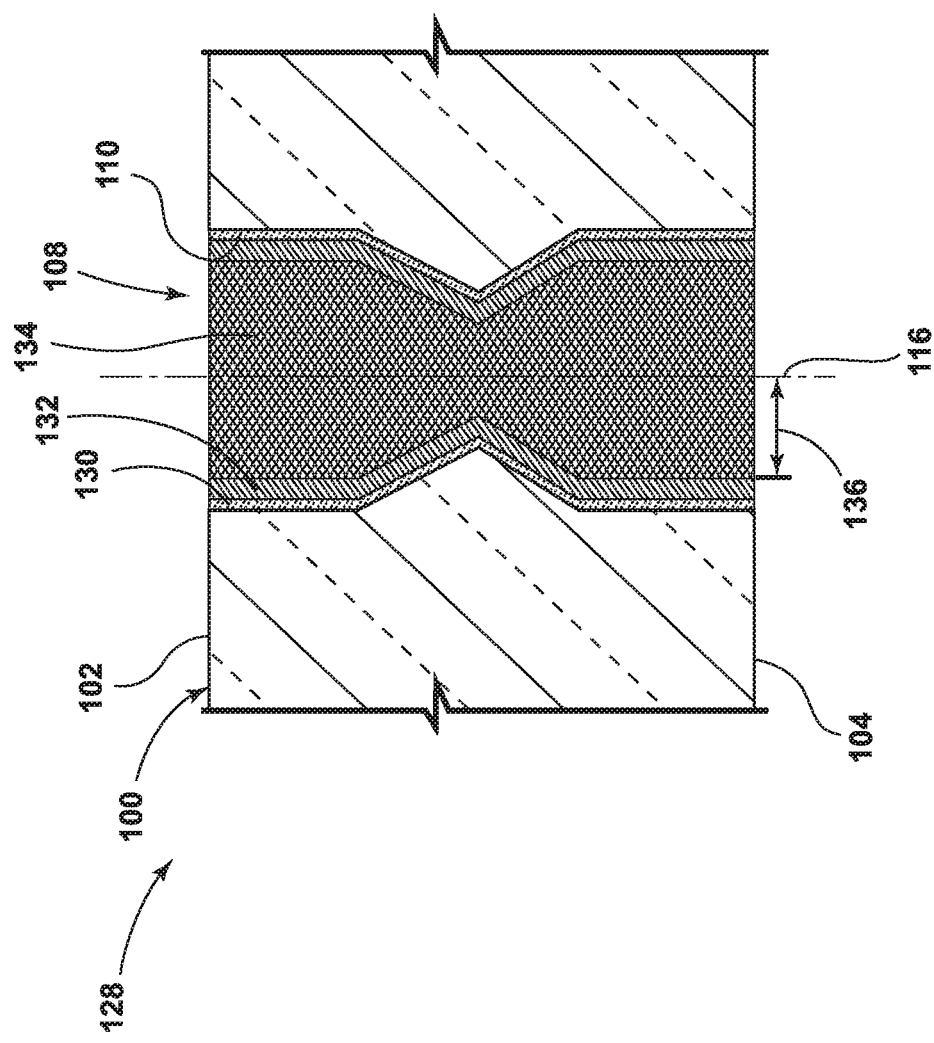
FIG. 7 is the same view as FIG. 6 but after another step of the method of FIG. 3, illustrating the deposition of a third layer of a primary metal over the metallic region to fill the remainder of, and thus fully metallize, the via.

Forming a Third Layer 134 of a Primary Metal on the Glass Article 128. In a step 212, the method 200 further comprises forming a third layer 134 of a primary metal on the metallic region 132 of the glass article 128 (see FIG. 7). The primary metal is "primary" in the sense that the metal is the predominant metal by thickness on the glass article 128—that is, a thickness 136 of the third layer 134 is greater that the thicknesses 122, 126 of the first layer 120 and the second layer 124, respectively. In the instance where the glass article 128 is an interposer, the primary metal is the metal intended to perform the conductive function of the via 108 and is the predominate metal within the via 108 after metallization pursuant to the method 200. In embodiments, the primary metal is or comprises copper. In embodiments, the primary metal is or comprises one or more of silver, gold, cadmium, chromium, copper, nickel, lead, platinum, and tin. In embodiments, the thickness 136 of the third layer 134 of the primary metal is 2 μm or greater, such as 2 μm to 5 μm.

In embodiments, forming the third layer 134 of the primary metal on the metallic region 132 of the glass article 128 comprises electroplating the third layer 134 of the primary metal onto the metallic region 132 of the glass article 128. In electroplating, the glass article 128 is placed in a plating solution, which contains an ionic compound having the cation of the primary metal to form the third layer 134 and an anion, and a current is applied. As a result, the primary metal in elemental form is applied over the metallic region 132 of the glass article 128 as the third layer 134. The anion of the ionic compound containing the cation of the primary metal to be deposited includes sulfate, nitrate, and chloride anions. An example ionic compound for use in the plating solution is copper sulfate. An example plating solution includes copper sulfate pentahydrate ($CuSO_4 \cdot 5H_2O$), potassium pyrophosphate ($K_4P_2O_7$), and citric acid in distilled water. Another example plating solution includes copper sulfate pentahydrate ($CuSO_4 \cdot 5H_2O$), manganese sulfate monohydrate ($MnSO_4 \cdot H_2O$), potassium sodium tartrate tetrahydrate (Rochelle salt), and formaldehyde. In embodiments, the concentration of the ionic compound in the plating solution is 0.001 M or greater. The ionic compounds are dissolved in a liquid medium, such as deionized water. In addition to the glass article 128, an electrode fabricated from any electrically conductive material is also disposed in the plating solution. In embodiments, the plating solution has a temperature between 10° C. and 50° C., such as room temperature or 40° C.

Current, voltage, or a combination thereof is applied between the electrode and the glass article 128 to provide a negative constant current to the glass article 128. In embodiments, a current density range of about 0.001 $mA/cm^2$ to about 1 $A/cm^2$ and a voltage range of about –0.001 V to about –20 V is provided. As a result, the cations of the primary metal to be the third layer 134 are reduced to elemental form over the metallic region 132 of the glass article 128. The current density controls the rate of this reduction reaction. Thus, the deposition rate may be increased or decreased by increasing or decreasing the applied current. However, it is noted that too high of an applied current may result in a porous and void filled deposit, and too low of an applied current may render the process too long to be practically useful. After the third layer 134 of the primary metal is applied to the glass article 128 over the metallic region 132, the current is stopped, the glass article 128 removed from the plating solution, and the glass article 128 can be cleaned with deionized water. The glass article 128 now may optionally be dried, such as by flowing a stream of nitrogen onto the glass article 128.

In embodiments where the glass article 128 is intended to be an interposer, the third layer 134 of the primary metal fills the remaining open portions of the vias 108. When the third layer 134 of the primary metal is added by electroplating, the glass article 128 is disposed in the plating solution such that the plating solution fills all of one or more of the vias 108. The third layer 134 of the primary metal is deposited on the metallic region 132 of the glass article 128 and continuously built up until the via 108 is hermetically sealed and thus fully metallized. In embodiments where the via 108 takes an hourglass shape, the narrow waist 114 provides a metal "bridge" for the electrically conductive third layer 134 of the primary metal to be initially deposited. The third layer 134 of the primary metal is continuously deposited on both sides of this bridge until the via 108 is filled. The "bridge" helps prevent deposition of the third layer 134 of the primary metal near the first surface 102 or the second surface 104 to avoid closure of the openings to the interior of the via 108 before it is filled with the third layer 134 of the primary metal. Such closure of the openings to the interior of the via 108 results in voids within the vias 108, which reduces conductivity. When the vias 108 are filled and fully metallized with the metallic region 132 and the third layer 134 of the primary metal, the vias 108 can electrically connect electrical traces of electrical components disposed on or adjacent the first surface 102 and the second surface 104 of the glass article 128. Once the third layer 134 of the primary metal fills the vias 108 of the glass article 128, the current is stopped and the plating solution and the glass article 128 are separated.

Figure 8:
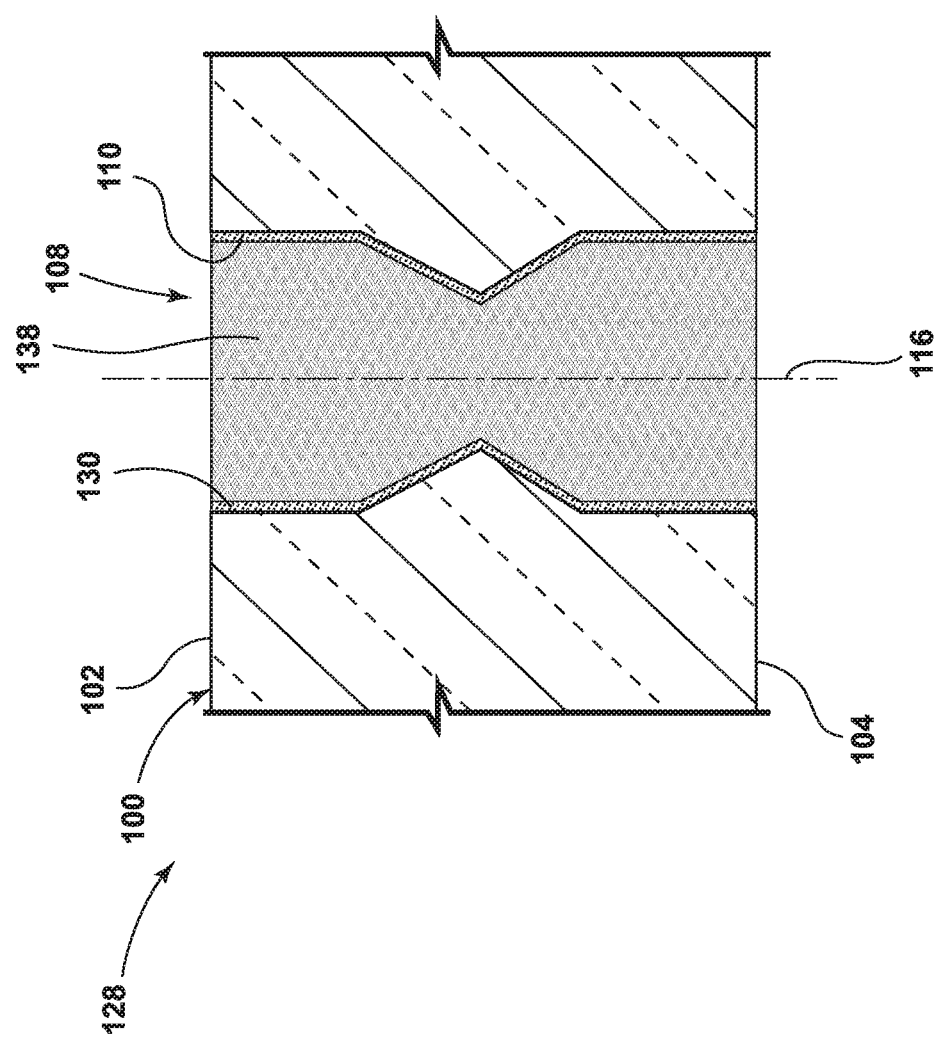
FIG. 8 is the same view as FIG. 7 but after another step of the method of FIG. 3, illustrating the formation of a new metallic region including the first metal, the second metal, the catalyst metal, and the primary metal all in elemental form, with the oxide of the first metal disposed between, and bonding to, the sidewall surface and the new metallic region.

Heat Treating the Glass Article 128 with the Third layer 134 of the Primary Metal. In a step 214, the method 200 further comprises subjecting the glass article 128 with the third layer 134 of the primary metal to a temperature of 250° C. to 600° C., such as 300° C. to 400° C., such as 325° C. to 375° C., such as about 350° C. or 350° C., in an inert environment (such as reduced pressure, nitrogen, or forming gas environment) for at least 30 minutes. The heat treatment step 214 forms the glass article 128 comprising: (i) the glass substrate 100; (ii) the oxide 130 of the first metal covalently bonded to the glass substrate 100; and (iii) a new metallic region 138 including the catalyst metal, the first metal, the second metal, and the primary metal all in elemental form (see FIG. 8). In other words, the heat treatment step 214 transforms the metallic region 132 created at step 208 into the new metallic region 138 that further includes the primary metal in elemental form.

One purpose of step 214 is to intermix the metallic region 132 from step 208 and the third layer 134 of the primary metal added at step 212. While temperatures below 325° C. may satisfy that purpose, such temperatures may require a time that is unreasonably long for practical purposes. In other words, temperature of below 325° C. for the step 214 may result in such intermixing but would likely take too long of a time period to be commercially practical. A temperature of 375° C. or less for the step 214 will be compatible with most glass substrates 100. Another purpose of the step 214 is to relieve stresses that may have developed in the glass article 128. For example, a laser process used to form the vias 108 in the glass substrate 100 intended to be used as an interposer can generate thermal stresses within the glass substrate 100. The annealing of the subsequent glass article 128 formed after the metallizing of the vias 108 relieves residual stresses that may be present in the glass substrate 100.

In embodiments where the glass article 128 is an interposer, the vias 108 are now completely metallized and the vias 108 comprise the oxide 130 of the first metal covalently bonded to the sidewall surface 110 of the vias 108 and the new metallic region 138 bonded to the oxide 130 of the first metal. The oxide 130 of the first metal is thus disposed between the sidewall surface 110 of the through-via 108 and the new metallic region 138. The new metallic region 138 forms an electrically conductive path through the through-via 108. The new metallic region 138 is disposed within the through-via 108 about the central axis 116. The new metallic region 138 includes the first metal in elemental form, which bonds to the oxide 130 of the first metal. In embodiments, portions of the first surface 102 and the second surface 104 of the glass substrate 100 are metallized, with the oxide 130 of the first metal covalently bonded to the first surface 102 and the second surface 104, and the new metallic region 138 including the catalyst metal, the first metal, the second metal, and the primary metal all in elemental form are bonded to the oxide 130 of the first metal. The new metallic region 138 is expected to be primarily the primary metal at and near the axis 116.

The formation and incorporation of the oxide 130 of the first metal increases the effective adhesion of the primary metal (e.g., copper) to the glass substrate 100. The second layer 124 of the alloy of the first metal and the second metal thus performs the functions of (i) facilitating adherence of subsequently applied metals to the glass substrate 100 through the formation of the oxide 130 of the first metal, and (ii) facilitating application of the third layer 134 of the primary metal because the second metal of the second layer 124 of the alloy is not apt to form an oxide and ensures that the metallic region 132 generated from the step 208 has sufficient conductivity to participate in the formation of the third layer 134 of the primary metal at the step 212 (such as via electroplating). The combination of the oxide 130 of the first metal covalently bonding to the sidewall surface 110 of the glass substrate 100 and the metallic bonding and intermixing of the catalyst metal, the first metal, the second metal, and the primary metal at the new metallic region 138 leads to strong adhesion of the primary metal to the glass substrate 100. Further, all of the steps 202, 206, 212 that form the first layer 120, the second layer 124, and the third layer 134 are all solution-based, which allows for the vias 108, even those with a high aspect ratio, to be fully metallized without significant voids (e.g., pinholes) in a cost-effective manner.

EXAMPLES

Example 1. Pursuant to the step 202 of the method 200, a first layer 120 of silver as a catalyst metal was formed on the first surface 102 of a sample of the glass substrate 100. The glass substrate 100 for this example and all further examples below was an alkaline earth aluminoborosilicate glass substrate. More specifically, nanoparticles of silver were dispersed in a liquid carrier. The nanoparticles had an average size of 10 to 13 nm. The liquid carrier was cyclohexane. The concentration of the silver nanoparticles was 20% (w/v) of cyclohexane. The dispersion was sonicated for 30 minutes to help separate agglomerations of the silver nanoparticles. The dispersion was then spin-coated onto the first surface 102 of the glass substrate 100 at 1000 RPM. The liquid carrier was allowed to evaporate. Then, pursuant to the step 204 of the method 200, the sample of the glass substrate 100 with the first layer 120 of the catalyst metal (silver) was subjected to 350° C. for 2 minutes in an environment of air, thus forming the glass substrate 100 with the catalyst metal disposed as a first layer 120 on the first surface 102.

Then, pursuant to step 206 of the method 200, a second layer 124 of an alloy was formed upon the catalyst metal through electroless deposition. The bath used in the electroless deposition had a composition as set forth in Table 2 below, with the ratio of the concentration of the ionic compound of manganese as the first metal to the concentration of the ionic compound of copper as the second metal being 1:4.

TABLE 2

| Component | Function | Formula | Concentration (mM) |
|---|---|---|---|
| Copper sulfate pentahydrate | Precursor | $CuSO_4 \cdot 5H_2O$ | 20 |
| Manganese sulfate monohydrate | Precursor | $MnSO_4 \cdot H_2O$ | 5 |
| Potassium sodium tartrate tetrahydrate (Rochelle salt) | Complexing agent | $KNaC_4H_4O_6 \cdot 4H_2O$ | 90 |
| Formaldehyde | Reducing agent | HCHO | 123 |

The pH of the electroless bath was adjusted to 12.5. The temperature of the electroless bath was maintained at 60° C. The glass substrate 100 with the catalyst metal of silver was immersed in the bath for 20 minutes. The glass substrate 100 was then removed from the bath, rinsed with water, and dried in an environment of nitrogen. The resulting second layer 124 was thus an alloy of manganese as the first metal and copper as the second metal.

Then, pursuant to the step 208 of the method 200, the glass substrate 100 with the second layer 124 of the alloy was subjected to a temperature of 400° C. for 30 minutes in an environment of air. The temperature was raised to 400° C. at a rate of 1° C. per minute. X-ray photoelectron spectroscopy (XPS) was utilized to determine the elemental composition of the resulting glass article 128 with the metallic region 132. The results are set forth in Table 3 below.

TABLE 3

| Element | C | O | Na | Si | K | Mn | Cu | Ag |
|---|---|---|---|---|---|---|---|---|
| Mol % | 25.3 | 40.4 | 2.9 | 4.6 | 1.1 | 2.9 | 5.8 | 17.0 |

The results demonstrate that the steps 202-208 did indeed result in the metallic region 132 including manganese and copper from the electroless bath and silver from the spin-coating. The presence of carbon is likely from the electroless bath or from the atmosphere.

Then, pursuant to the step 212 of the method 200, a third layer 134 of a primary metal (copper) was applied over the metallic region 132 via an electroplating process. The electroplating process utilized a non-acidic plating solution of copper sulfate dissolved in deionized water. Copper plate was used as the anode. A constant current of 50 mA for a time period of 1 hour resulted in the third layer 134 of copper having a thickness 134 of 2.5 µm. The glass article 128 was then removed from the plating solution and rinsed.

Then, pursuant to the step 214 of the method 200, the glass article 128 with the third layer 134 of the primary metal (copper) was subjected to a temperature of 350° C. under reduced pressure for a time period of 30 minutes. The ramp rate to 350° C. was controlled at 5° C. per minute.

Figure 9:
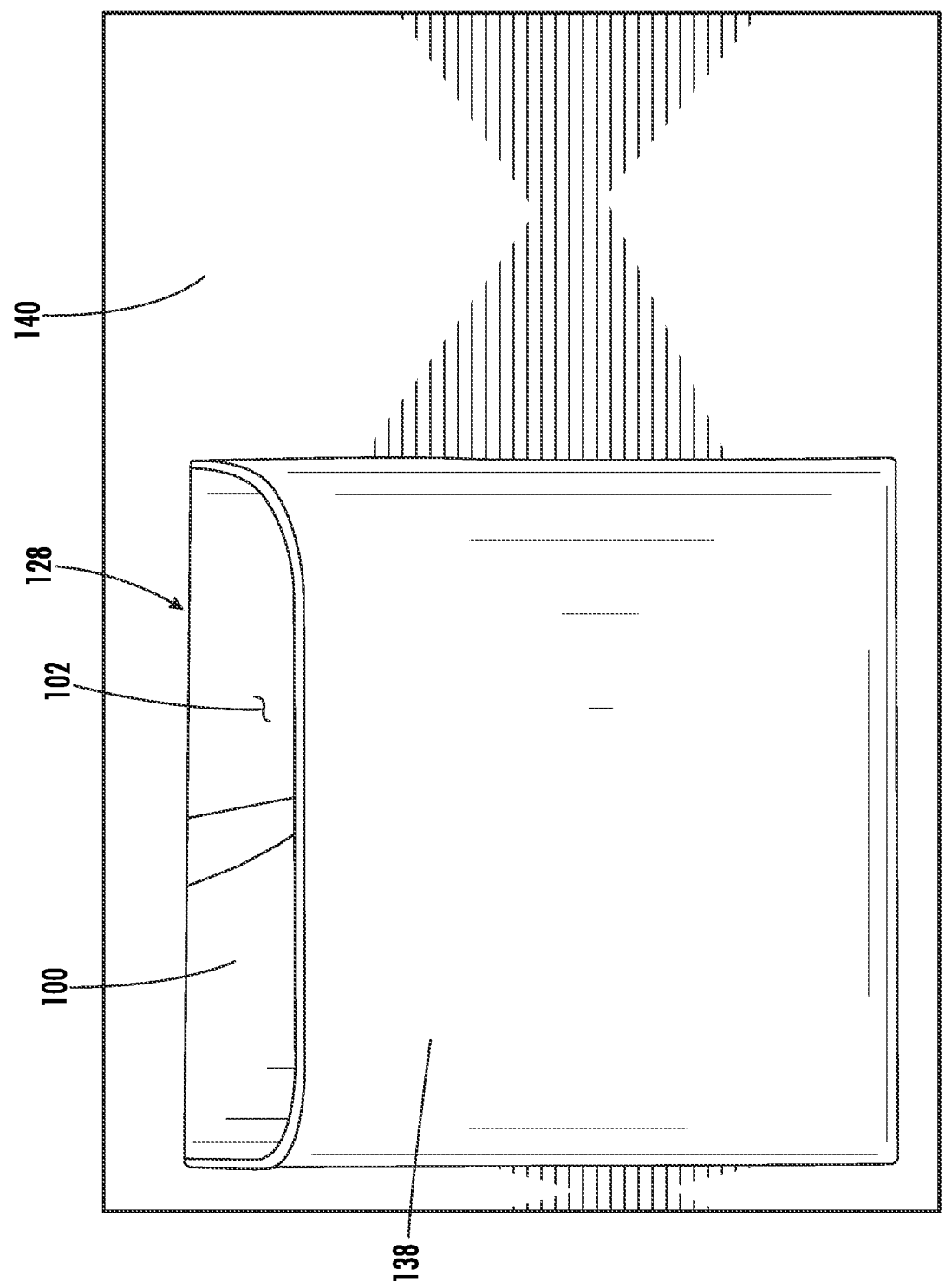
FIG. 9 is a picture of the results of a tape pull test on a sample glass article made pursuant to the method of FIG. 3, illustrating that the tape did not pull much of the new metallic region from the first surface of the glass substrate, thus indicating a high level of adherence.

Referring now to FIG. 9, a cross-hatch tape test was performed on the resulting glass article 128 pursuant to ASTM D3359-09 (Standard Test Methods for Measuring Adhesion by Tape Test), to test the bonding (adhesion) of the new metallic region 138 to the glass substrate 100. For the tape test, a lattice pattern with eleven cuts in each direction was made into the new metallic region 138. Pressure-sensitive tape 140 was then applied over the lattice pattern. The tape 140 was then peeled off. The amount and type of removal was then compared to descriptions and illustrations in the ASTM documentation. The peeling of the tape 140 removed less than 5% of the new metallic region 138 from the glass article 128. In terms of the ASTM standard, the test result was 4B or 5B. This shows a high level of bonding of the new metallic region 138 including copper, manganese, and silver to the glass substrate 100.

Example 2. Pursuant to the steps 202 and 204 of the method 200, a first layer 120 of silver as a catalyst metal was formed on the first surface 102 of a sample of the glass substrate 100, and subsequently heat treated, in the same manner as Example 1.

Then, pursuant to the step 206 of the method 200, the second layer 124 of an alloy was formed upon the catalyst metal through electroless deposition. The bath used in the electroless deposition had a composition as set forth in Table 4 below.

TABLE 4

| Component | Function | Formula | Concentration (mM) |
|---|---|---|---|
| Copper sulfate pentahydrate | Precursor | $CuSO_4 \cdot 5H_2O$ | 20 |
| Zinc chloride | Precursor | $ZnCl_2$ | 5 |
| Potassium sodium tartrate tetrahydrate (Rochelle salt) | Complexing agent | $KNaC_4H_4O_6 \cdot 4H_2O$ | 90 |
| Formaldehyde | Reducing agent | HCHO | 123 |

The pH of the electroless bath was adjusted to 12.5. The temperature of the electroless bath was maintained at 60° C. The glass substrate 100 with the catalyst metal of silver was immersed in the bath for 20 minutes. The glass substrate 100 was then removed from the bath, rinsed with water, and dried in an environment of nitrogen. The resulting second layer 124 was thus an alloy of zinc as the first metal and copper as the second metal.

Then, pursuant to the step 208 of the method 200, the glass substrate 100 with the second layer 124 of the alloy was subjected to a temperature of 400° C. for 30 minutes in an environment of air. The temperature was raised to 400° C. at a rate of 1° C. per minute. X-ray photoelectron spectroscopy (XPS) was utilized to determine the elemental composition of the metallic region 132 after the heat treatment step 208. The results are set forth in Table 5 below.

TABLE 5

| Element | C | O | Na | Si | K | Cu | Zn | Ag |
|---|---|---|---|---|---|---|---|---|
| Mol % | 28.2 | 40.1 | 2.7 | 3.1 | 1.0 | 11.1 | 3.8 | 7.9 |

The results demonstrate that steps 202-208 did indeed result in a metallic region 132 including zinc and copper from the electroless bath and silver from the spin-coating.

Then, pursuant to steps 212, 214 of the method 200, a third layer 134 of a primary metal (copper) was applied over the metallic region 132 via an electroplating process, and then heat treated, in the same manner as Example 1.

Figure 10:
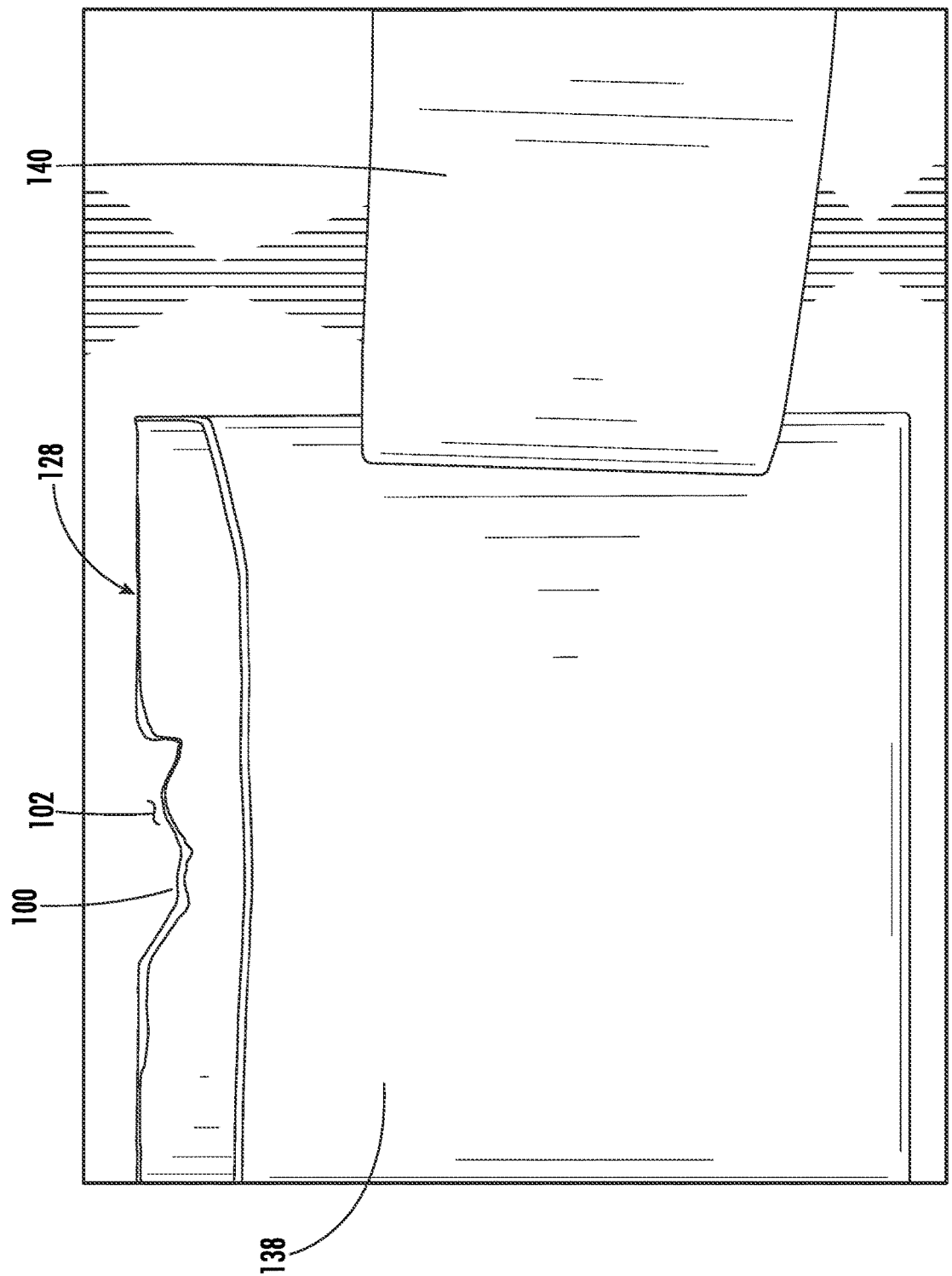
FIG. 10 is a picture of the results of a tape pull test on another sample glass article made pursuant to the method of FIG. 3, illustrating that the tape did not pull much of the new metallic region from the first surface of the glass substrate, thus indicating a high level of adherence.

Referring now to FIG. 10, a cross-hatch tape test was performed on the resulting glass article 128 pursuant to ASTM D3359-09, to test the bonding (adhesion) of the resulting new metallic region 138 to the glass substrate 100. For the tape test, a lattice pattern with eleven cuts in each direction was made into the new metallic region 138. Pressure-sensitive tape 140 was then applied over the lattice pattern. The tape 140 was then peeled off. The amount and type of removal was then compared to descriptions and illustrations in the ASTM documentation. The peeling of the tape 140 removed less than 5% of the new metallic region 138 from the glass article 128. In terms of the ASTM standard, the test result was 4B. This shows a high level of bonding of the new metallic region 138 including copper, zinc, and silver to the glass substrate 100.

Example 3. Pursuant to the steps 202 and 204 of the method 200, a first layer 120 of palladium as a catalyst metal was formed on the first surface 102 of a sample of the glass substrate 100, and subsequently heat treated, in the same manner as Example 1.

Then, pursuant to step 206 of the method 200, the second layer 124 of an alloy was formed upon the first layer 120 of the catalyst metal through electroless deposition. The composition of the electroless bath is set forth in Table 6 below.

TABLE 6

| Component | Function | Formula | Concentration (mM) |
|---|---|---|---|
| Copper sulfate pentahydrate | Precursor | $CuSO_4 \cdot 5H_2O$ | 20 |
| Manganese sulfate monohydrate | Precursor | $MnSO_4 \cdot H_2O$ | 2.5 |
| Potassium sodium tartrate tetrahydrate (Rochelle salt) | Complexing agent | $KNaC_4H_4O_6 \cdot 4H_2O$ | 90 |
| Formaldehyde | Reducing agent | HCHO | 123 |

The temperature of the electroless bath was maintained at 43° C. The second layer 124 is thus an alloy of manganese as the first metal and copper as the second metal. Pursuant to the step 208 of the method 200, the glass substrate 100 with the second layer 124 of the alloy of manganese and copper was subjected to 400° C. for 30 minutes in an environment of air after a controlled temperature rise of 1° C. per minute. Then, pursuant to step 210 of the method 200, the resulting glass article 128 was subjected to a temperature of 250° C. for 30 minutes in forming gas, which reduced any oxidized copper resulting from step 208 that occurred in an environment of air.

Then, pursuant to the step 212 of the method 200, a third layer 134 of a primary metal (copper) was applied over the metallic region 132 via an electroplating process. The third layer 134 has a thickness 134 of 2.5 μm.

Then, pursuant to step 214 of the method 200, the glass article 128 with the third layer 134 of the primary metal (copper) was subjected to a temperature of 350° C. under reduced pressure for 30 minutes.

Figure 11:
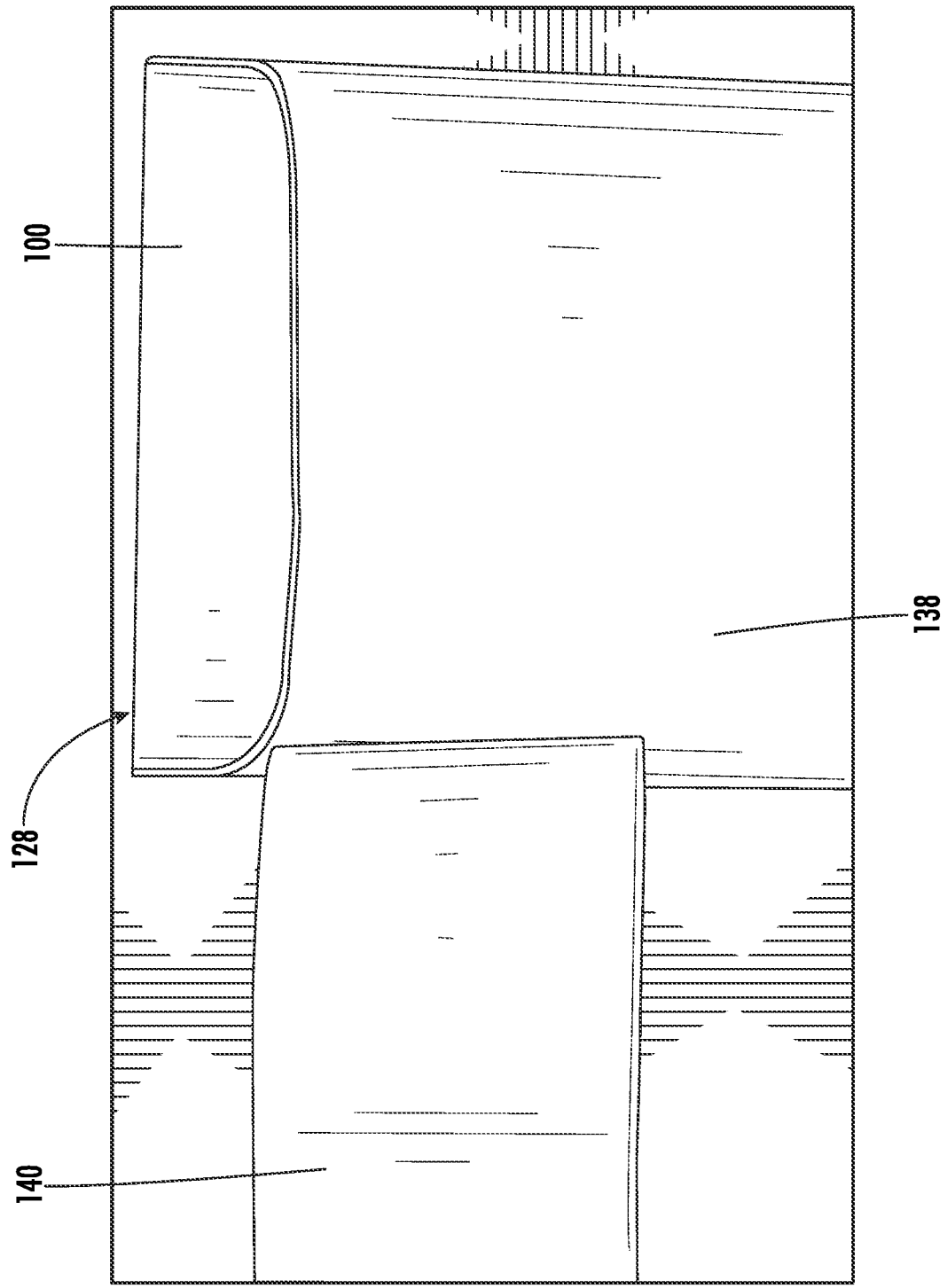
FIG. 11 is a picture of the results of a tape pull test on another sample glass article made pursuant to the method of FIG. 3, illustrating that the tape did not pull much of the new metallic region from the first surface of the glass substrate, thus indicating a high level of adherence.

Referring now to FIG. 11, a cross-hatch tape test was performed on the resulting glass article 128 pursuant to ASTM D3359-09, to test the bonding (adhesion) of the new metallic region 138 to the glass substrate 100. For the tape test, a lattice pattern with eleven cuts in each direction was made into the new metallic region 138. Pressure-sensitive tape 140 was then applied over the lattice pattern. The tape 140 was then peeled off. The amount and type of removal was then compared to descriptions and illustrations in the ASTM documentation. The peeling of the tape 140 removed less than 5% of the new metallic region 138 from the glass article 128. In terms of the ASTM standard, the test result was 4B. This shows a high level of bonding of the new metallic region 138 including copper, manganese, and silver, to the glass substrate 100, even with a reduced concentration of manganese in the electroless bath than the electroless bath of Example 1.

Comparative Example 1. For Comparative Example 1, a first layer 120 of catalyst metal (silver) was added to a first surface 102 of a glass substrate 100 and subjected to an elevated temperature to create a glass substrate 100 with the catalyst metal. No second layer 124 of an alloy of a first metal (prone to form an oxide 130) and a second metal was deposited upon the first layer 120. Instead, a 2.5 μm thick layer of copper was electroplated onto the first layer 120 of the catalyst metal and subjected to elevated temperature under reduced pressure for a period of time.

Figure 12:
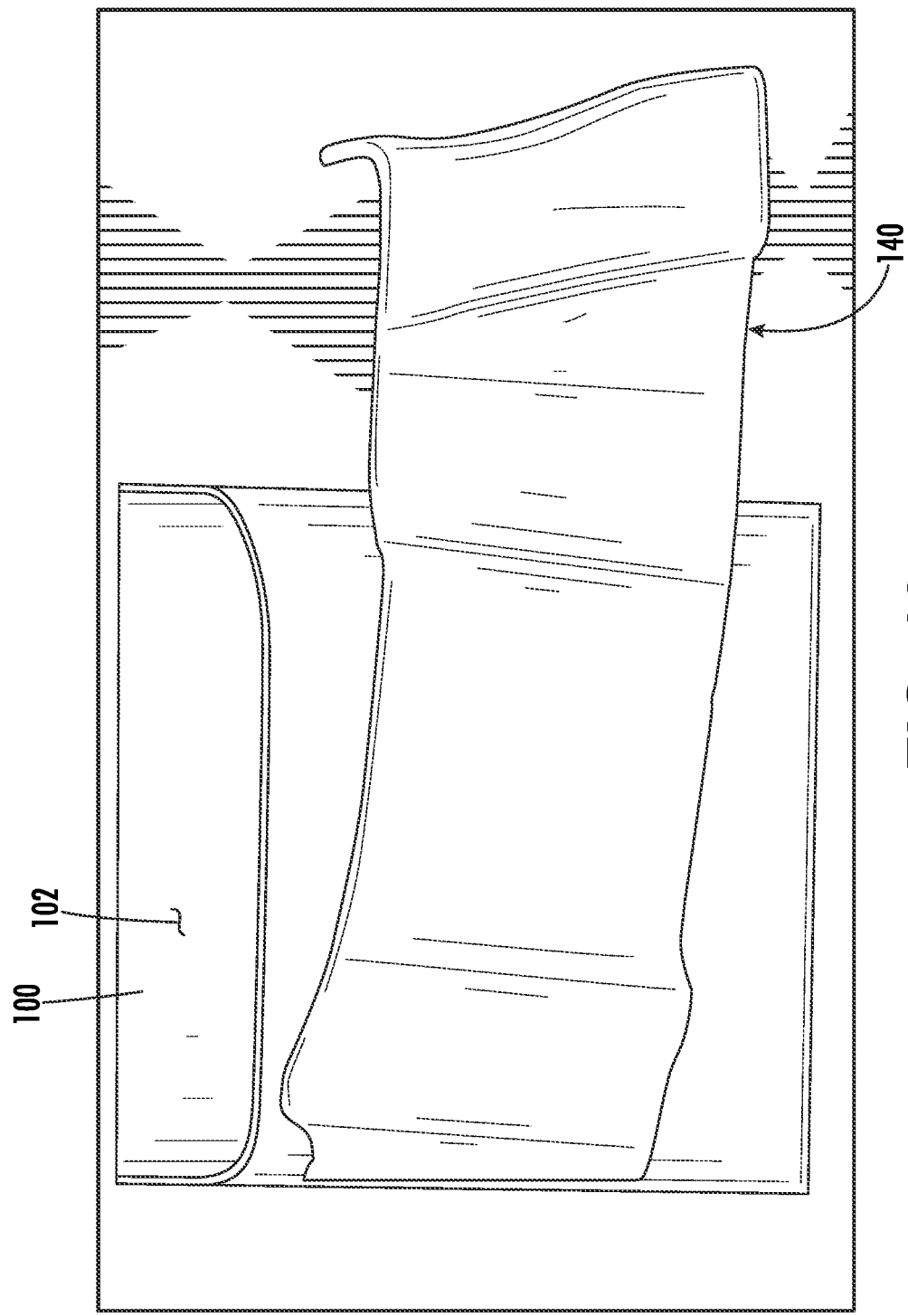
FIG. 12 is a picture of the results of a tape pull test on a sample glass article not made pursuant to the method of FIG. 3, illustrating that the tape pulled much of the deposited metals from the first surface of the glass substrate, thus indicating a low level of adherence.

Referring now to FIG. 12, a cross-hatch tape test was performed pursuant to ASTM D3359-09, to test the bonding (adhesion) of the electroplated copper and the silver to the glass substrate 100. For the tape test, a lattice pattern with eleven cuts in each direction was made into metals. Pressure-sensitive tape 140 was then applied over the lattice pattern. The tape 140 was then peeled off. The amount and type of removal was then compared to descriptions and illustrations in the ASTM documentation. The peeling of the tape 140 removed essentially all of the electroplated copper and spin-coated silver from the glass substrate 100. In terms of the ASTM standard, the test result was 0B. This shows a very low level of bonding of the electroplated copper and spin-coated silver to the glass substrate 100. This illustrates that the steps of the method 200 to apply an alloy including a first metal that forms an oxide 130 that bonds with the first surface 102 of the glass substrate 100 is important to bond the primary metal to the first surface 102 of the glass substrate 100.

Comparative Example 2. For Comparative Example 2, a first layer 120 of catalyst metal (silver) was added to a first surface 102 of a glass substrate 100 and subjected to an elevated temperature. Then, instead of electrolessly depositing a second layer 124 of an alloy of a first metal (prone to form an oxide 130) and a second metal onto the catalyst metal, only copper (not prone to form an oxide 130) was electrolessly deposited onto the first layer 120. The glass substrate 100 with the first layer 120 of silver and the layer of copper electrolessly deposited was then subjected to 400° C. for 30 minutes, after a controlled ramp up to that temperature at a rate of 1° C. per minute in an environment of air. The sample was then subjected to 250° C. for 30 minutes in an environment of forming gas. A 2.5 μm thick layer of copper was electroplated over the layer of electrolessly deposited copper. The sample was then subjected to 350° C. under reduced pressure for 30 minutes.

Figure 13:
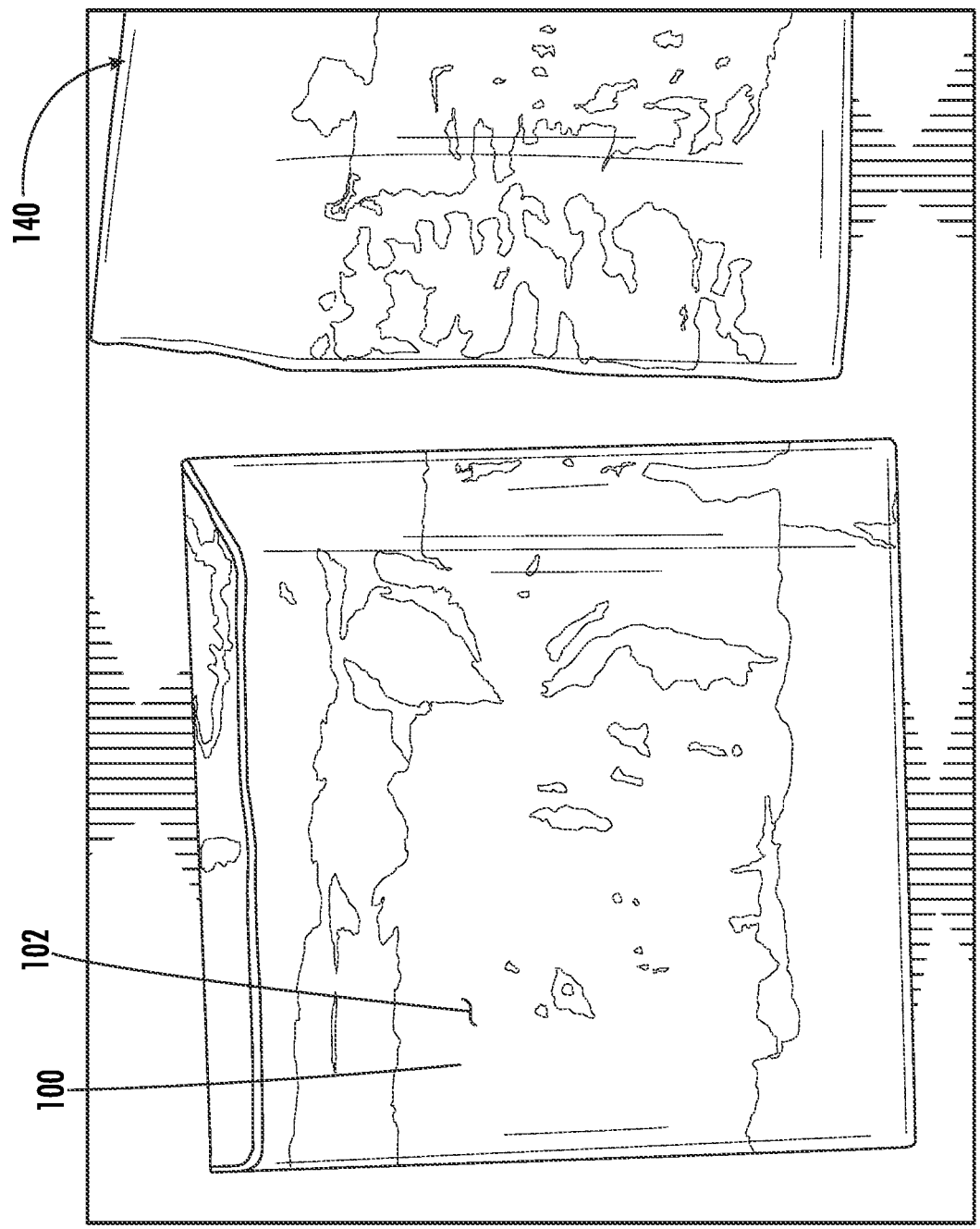
FIG. 13 is a picture of the results of a tape pull test on another sample glass article not made pursuant to the method of FIG. 3, illustrating that the tape pulled much of the deposited metals from the first surface of the glass substrate, thus indicating a low level of adherence.

Referring now to FIG. 13, a cross-hatch tape test was performed on the resulting glass article pursuant to ASTM D3359-09), to test the bonding (adhesion) of electroplated copper, the electrolessly deposited copper, and the spun-coat silver to the glass substrate 100. For the tape test, a lattice pattern with eleven cuts in each direction was made into the new metallic region. Pressure-sensitive tape 140 was then applied over the lattice pattern. The tape 140 was then peeled off. The amount and type of removal was then compared to descriptions and illustrations in the ASTM documentation. The peeling of the tape 140 removed approximately 100% of the deposited metals from the glass substrate 100. In terms of the ASTM standard, the test result was 0B. This shows a very low level of bonding of the deposited metals to the glass substrate 100. This illustrates that the step 206 of the method 200 to apply an alloy including a first metal that forms an oxide 130 that bonds with the first surface 102 of the glass substrate 100 is important to bond the primary metal (e.g., copper) as well as the other metals to the first surface 102 of the glass substrate 100.

It will be apparent to those skilled in the art that various modifications and variations can be made without departing from the spirit or scope of the claims.

What is claimed is:

1. A method of manufacturing a glass article comprising: forming a first layer of a catalyst metal on a surface of a glass substrate; subjecting the glass substrate with the first layer of the catalyst metal to a temperature of 150° C. to 600° C. for at least 2 minutes; forming a second layer of an alloy of a first metal and a second metal on the first layer; subjecting the glass substrate with the second layer of the alloy of the first metal and the second metal on the first layer of the catalyst metal to a temperature of 250° C. to 600° C. for at least 30 minutes, thereby forming the glass article comprising: (i) the glass substrate; (ii) an oxide of the first metal covalently bonded to the glass substrate; and (iii) a metallic region bonded to the oxide of the first metal, the metallic region comprising the catalyst metal in elemental form, the first metal in elemental form, and the second metal in elemental form; forming a third layer of a primary metal on the metallic region of the glass article; subjecting the glass article with the third layer of the primary metal to a temperature of 250° C. to 600° C. in an inert environment for at least 30 minutes thereby forming the glass article comprising: (i) the glass substrate; (ii) an oxide of the first metal covalently bonded to the glass substrate; and (iii) a new metallic region comprising the catalyst metal, the first metal in elemental form, the second metal in elemental form, and the primary metal in elemental form, wherein subjecting the glass substrate with the first layer of the catalyst metal to a temperature of 150° C. to 600° C. for at least 2 minutes comprises: subjecting the glass substrate with the first layer of the catalyst metal to a temperature of 325° C. to 375° C. for at least 2 minutes; subjecting the glass substrate with the second layer of the alloy of the first metal and the second metal on the first layer of the catalyst metal to a temperature of 250° C. to 600° C. for at least 30 minutes comprises: subjecting the glass substrate with the second layer of the alloy of the first metal and the second metal on the first layer of the catalyst metal to a temperature of 300° C. to 425° C. for at least 30 minutes; and subjecting the glass article with the third layer of the primary metal to a temperature of 250° C. to 600° C. in an inert environment for at least 30 minutes comprises: subjecting the glass article with the third layer of the primary metal to a temperature of 300° C. to 400° C. in an inert environment for at least 30 minutes.

2. The method of claim 1, wherein forming the first layer of the catalyst metal on the surface comprises: contacting the surface with a suspension comprising nanoparticles of the catalyst metal dispersed in a liquid carrier; and evaporating the liquid carrier.

3. The method of claim 1, wherein the glass substrate comprises a first surface and a second surface as primary surfaces of the glass substrate, and a sidewall surface defining a through-via open at the first surface and the second surface and extending through the glass substrate; and the oxide of the first metal is covalently bonded to the sidewall surface of the through-via.

4. The method of claim 1, wherein the glass substrate comprises a first surface and a second surface as primary surfaces of the glass substrate, and a sidewall surface defining a through-via open at the first surface and the second surface and extending through the glass substrate; the oxide of the first metal is covalently bonded to the sidewall surface of the through-via; and the new metallic region forms an electrically conductive path through the though-via.

5. The method of claim 1, wherein the catalyst metal comprises one or more of silver, gold, cobalt, cobalt-phosphorous, nickel, or nickel-phosphorous, palladium, and platinum; the first metal of the second layer comprises one or more of tantalum, niobium, aluminum, manganese, rhenium, hafnium, chromium, zirconium, titanium, indium, tungsten, magnesium, molybdenum, nickel, and zinc; and the second metal of the second layer comprises one or more of silver, palladium, and copper.

6. The method of claim 1, wherein the oxide of the first metal excludes the second metal.

7. The method of claim 1, wherein an oxide of the first metal of the alloy has an enthalpy of formation, the absolute value of which is greater than 600 kJ per mole; and an oxide of the second metal of the alloy has an enthalpy of formation, the absolute value of which is less than 600 kJ per mole.

8. The method of claim 1, wherein forming the second layer of the alloy comprises electroless plating the second layer on the first layer using a solution, the solution comprising a salt of the first metal dissolved in the solution, and a salt of the second metal dissolved in the solution.

9. The method of claim 1, wherein subjecting the glass substrate with the second layer of the alloy of the first metal and the second metal on the first layer of the catalyst metal to the temperature of 250° C. to 600° C. is performed with the glass substrate in the presence of air; and the method further comprises, after subjecting the glass article to the temperature of 375° C. to 425° C., subjecting the glass article to a temperature of 225° C. to 275° C. for at least 30 minutes with the glass article in the presence of forming gas.

10. The method of claim 1, wherein the primary metal comprises one or more of silver, gold, cadmium, chromium, copper, nickel, lead, platinum, and tin.

11. The method of claim 1, wherein the third layer has a thickness of 2 μm to 5 μm.

12. The method of claim 1, wherein forming the third layer of the primary metal on the metallic region of the glass article comprises electroplating the third layer of the primary metal onto the metallic region of the glass article.

\* \* \* \* \*